United States Patent
Inoue et al.

[11] Patent Number: 5,926,238
[45] Date of Patent: Jul. 20, 1999

[54] IMAGE DISPLAY DEVICE, SEMICONDUCTOR DEVICE AND OPTICAL ELEMENT

[75] Inventors: Shunsuke Inoue, Yokohama; Mamoru Miyawaki, Isehara; Junichi Hoshi, Hadano; Tetsunobu Kohchi, Hiratsuka, all of Japan

[73] Assignee: Canon Kabushiki Kaisha, Tokyo, Japan

[21] Appl. No.: 08/833,116

[22] Filed: Apr. 4, 1997

Related U.S. Application Data

[63] Continuation of application No. 08/612,479, Mar. 7, 1996, abandoned, which is a continuation of application No. 08/162,808, Dec. 7, 1993, abandoned.

[30] Foreign Application Priority Data

Dec. 11, 1992 [JP] Japan .................................. 4-352365
Apr. 9, 1993 [JP] Japan .................................. 5-105987
Nov. 29, 1993 [JP] Japan .................................. 5-320893

[51] Int. Cl.⁶ .......................... G02F 1/1335; G02F 1/133; G02F 1/01; G02F 1/13
[52] U.S. Cl. .......................... 349/61; 349/104; 349/116; 250/330; 250/331
[58] Field of Search .................................. 250/330, 331; 359/43–45, 48–50, 60, 72; 349/24, 25

[56] References Cited

U.S. PATENT DOCUMENTS

| | | | |
|---|---|---|---|
| 4,179,203 | 12/1979 | Hirohata et al. | 354/106 |
| 4,436,376 | 3/1984 | Fergason | 359/48 |
| 4,496,981 | 1/1985 | Ota | 348/294 |
| 4,655,552 | 4/1987 | Togashi et al. | 349/24 |
| 4,679,910 | 7/1987 | Efron et al. | 250/331 |
| 4,763,993 | 8/1988 | Vogeley et al. | 359/70 |
| 4,884,875 | 12/1989 | Okumura | 359/55 |
| 5,124,545 | 6/1992 | Takanashi et al. | 359/72 |
| 5,227,619 | 7/1993 | Vilaire et al. | 250/206.2 |
| 5,396,351 | 3/1995 | Gessel | 349/96 |

FOREIGN PATENT DOCUMENTS

| | | |
|---|---|---|
| 0081827 | 6/1983 | European Pat. Off. . |
| 0242663 | 10/1987 | European Pat. Off. . |
| 0499320 | 8/1992 | European Pat. Off. . |
| 2652724 | 6/1977 | Germany . |
| 3841575 | 7/1989 | Germany . |
| 62-014465 | 1/1987 | Japan . |
| 1241511 | 9/1989 | Japan . |
| 2012023 | 1/1990 | Japan . |
| 4225323 | 8/1992 | Japan . |
| 4240438 | 8/1992 | Japan . |
| 4347127 | 12/1992 | Japan . |
| 4355427 | 12/1992 | Japan . |

OTHER PUBLICATIONS

Chenson Chen, et al., "Ultraviolet, Visible, and Infared Response of PtSi Schotty–Barrier Detectors Operated in the Front–Illuminated Mode", IEEE Transactions on Electron Devices, vol. 38, No. 5, pp. 1094–1109 (May 1991).

Axel Richter, et al., "Current–Induced Light Emission from a Porous Silicon Device", IEEE Electron Device Letters, vol. 12, No. 12, pp. 691–692 (Dec. 1991).

*Primary Examiner*—William L. Sikes
*Assistant Examiner*—Toan Ton
*Attorney, Agent, or Firm*—Fitzpatrick, Cella, Harper & Scinto

[57] ABSTRACT

An optical apparatus includes at least an image display device, a light source for illuminating the image display device, a light-receiving device for receiving the light reflected from the eye of an observer, and a calculation device for calculating the line of sight of the observer based on the output of the light-receiving means. At least part of the illuminating light from the light source is utilized as the illuminating light for illuminating the eye of the observer.

18 Claims, 31 Drawing Sheets

PURKINJE IMAGE SHIFT (mm)

IMAGE DISPLAY DEVICE, SEMICONDUCTOR DEVICE AND OPTICAL ELEMENT

This application is a continuation of application Ser. No. 08/612,479, filed Mar. 7, 1996, which is a continuation of application Ser. No. 08/162,808, filed Dec. 7, 1993, now both abandoned.

BACKGROUND OF THE INVENTION

1. Field of the Invention

The present invention relates to an image display device adapted for use as display means in an electronic still camera, a video camera or the like, a semiconductor device adapted for use in various optical sensors, and optical equipment equipped with the image display device and/or the semiconductor device mentioned above, and more particularly to an image display device and/or a semiconductor device adapted for use in detection of line of sight or optical detection, optical equipment having such function of detection of line of sight or optical detection.

2. Related Background Art

The image display devices are available in different sizes, and are being used in various applications such as television, monitors for office equipment, monitors (view finders) of electronic still cameras or video cameras etc.

Also the image display devices are known in various types, such as a liquid crystal display device, CRT (cathode ray tube) a, plasma display, EL (electro-luminescence) display etc. Among these, the liquid crystal display device is being utilized in various applications because of various advantages such as light weight, possibility of compactization, ease of full-color display and low electric power consumption.

On the other hand, the apparatus for recording images on a silver halide-based film, namely the camera, has recently shown remarkable progress particularly in the automatic focusing technology. Within this field there is already known a technology for detecting the direction of the line of sight of the observer (photographer) and automatically focusing the phototaking lens to such observed position, as disclosed in the Japanese Patent Laid-open Application Nos. 1-241511 and 4-240438.

This invention aim at achieving, for example, convenient auto focusing function of larger freedom "by providing a finder device for observing an object, illumination means for illuminating the eye of the observer looking into the finder device, a condensing optical system for condensing the reflected light from the eye of the observer, photoelectric conversion means for receiving the condensed reflected light, and calculation means for calculating the direction of the line of sight of the observer from the output of the photoelectric conversion means, and controlling at least one of the phototaking condition setting means of the camera according to the result of calculation of the calculation means."

An example of the sight line detecting device will be schematically explained with reference to FIG. 1. An infrared light source 2901 constituting a point light source illuminates an eyeball 105 through a condensing lens 2902 and a half mirror 2903. The human eye can be considered as an adhered lens, with the front face 106a of the cornea, the rear face 106b thereof, the front face 108a of the lens and the rear face 108b thereof as the adhering faces or the interfaces, and the iris 107 is positioned close to the front face of the lens. The variations in the refractive index are different at these adhering faces, and the reflection occurs in the descending order of the front face of the cornea, the front face of the lens, the rear face thereof, and the rear face of of the cornea. Also the paraxial tracking indicates that the reflected images at the different interfaces, in response to a parallel incident light beam, are positioned as shown in FIG. 2, when the eyeball is seen from the front.

As shown in FIG. 2, the reflected images of the interfaces are focused at positions, measured from the front face 106a of the cornea, of 3.990, 4.017, 4.251 and 10.452 mm in the order of the 1st, 2nd, . . . faces. These values correspond to the standard shape and values, shown in the following, of the human eye.

standard radius of curvature of 106a=7.98 mm
standard radius of curvature of 106b=6.22 mm
standard radius of curvature of 108a=10.20 mm
standard radius of curvature of 108b=61.7 mm
refractive index between 106a–106b: $n_1$=1.376
refractive index between 106b–108a: $n_2$=1.336
refractive index between 108a–108b: $n_3$=1.406
refractive index to the right of 108b: $n_4$=1.336

These images are called Purkinje's images. The reflected images by the eye of the observer are guided by the inverse path, then reflected by the half mirror 2904, and enter a photoelectric converter 2905, on which the Purkinje's images reflected at different interfaces are focused. The Purkinje's images appear as point images arranged linearly on the optical axis of the eyeball but, if the line of sight is directed to either direction by the rotation of the eyeball, the illuminating light enters obliquely to the optical axis of the eyeball, so that the Purkinje's images move to positions deviated from the center of the pupil. Thus there can be observed plural Purkinje's images, because the amount and direction of movement of the Purkinje's image depend on the interface where the Purkinje's image is formed. The direction of the line of sight can be detected by electrically finding the movement of these Purkinje's images and, if necessary, the centers of the pupil and the iris.

This principle will be briefly explained with reference to FIGS. 3 and 4. Referring to FIG. 3, when the iris 3102, pupil 3103, Purkinje's 1st image 3104 and Purkinje's 2nd image 3105 are detected as illustrated on a device consisting of a two-dimensional array of photoelectric converting elements 3101, the elements for example of the 7th row and the 5th column provide the illustrated outputs. Thus a position ($x_5$, $y_7$) providing a 1st peak and a position ($x_{10}$, $y_7$) providing a 2nd peak are respectively detected as 1st and 2nd images, and the rotation angle of the eyeball can be calculated, according to FIG. 4, from the amount of positional aberration of the two images, or the amount of displacement of the Purkinje's images.

FIG. 1 shows a conventional configuration of a sight line detecting device for auto focusing control by the feedback of thus detected information of the watching point of the observer.

As shown in FIG. 1, the sight line detecting device includes a light-emitting device used for the light source 2901 and a photosensor used for the photoelectric converter 2905. Also apart from the detection of the line of sight, there are already known various light-emitting devices and photosensors, usable for the purpose of projecting light to an object and detecting the reflected light thereby detecting the image or position of the object.

In a signal processing system for reading the coordinates of an optical image by light irradiation, as shown in FIG. 5, the light source 3301 need not be an array but can be a point light source as long as it can uniformly illuminate the entire object 3302 which randomly reflects the light at the surface. For this reason there is generally used an inexpensive light-emitting element such as an LED. By uniform illumination on the object 3302, the light containing positional information enters a photosensor 3304 through an optical system 3303 of the system.

The photosensor 3304 requires at least one-dimensional array unless it is not equipped with a geometrical scanning mechanism. The photosensor 3304 is generally composed of a photodiode array or the like for simple positional detection, and a CCD for more complex image recognition.

Attention is now being attracted to a recently discovered light-emitting phenomenon in Si which is an indirect transition semiconductor material. For example, monocrystalline silicon emits light at discontinuity of the crystal, such as a defect, when a large current of the order of 1 mA is given. Also at the interface of polysilicon and monocrystalline silicon, the light emission is possible by the current force. A similar light-emitting phenomenon is also known in amorphous silicon. The most famous light-emitting phenomenon is reported by Axel Richter et al. in "Current-Induced Light Emission from a Porous Silicon Device", IEEE Electron Device Letters, Vol. 12, No. 12, December 1991, pp. 691–692.

The porous silicon emits red light with a good efficiency, and is attracting attention as the future light source.

However, for applying the aforementioned detection of the line of sight of the observer to an image display device such as a view finder, there are required a new light source for such sight line detection, an optical system for condensing the light in a predetermined position in the view finder. Stated differently, independently from the light coming for example from the light, there is required light of a desired intensity, preferably invisible to the human eyes.

Consequently there is required a space for the light source for the sight line detection, the photoelectric converting device, and the optical system if necessary, leading often to the drawbacks of increased size and cost of the equipment.

More specifically there are required anew an LED light source 2901 for obtaining infrared or near-infrared light for the detection of the line of sight, and a light-splitting half mirror 2904, and these components not only increase the dimension of the equipment in optical designing but also the number of component parts, thus raising the cost.

Besides, if the light emission intensity of the LED light source is increased in order to improve the sensitivity of detection, increases will result in the power consumption and in heat generation, hindering the compactization and power saving of the equipment. Furthermore, there is requirement for avoiding entry of an unnecessary amount of light into the eyeball.

As explained above, when the photoelectric conversion means and the driving means therefor, for the detection of the line of sight, are provided independently from the main image display device, there are required additional space and components for such detecting function, leading to an increased cost of the product.

On the other hand, in an optical signal processing system as shown in FIG. 5, the light source and the photosensor are generally constructed independently, and the light source 3301 is usually composed of a semiconductor device capable of providing a high intensity such as a Ga—As device, or a small lamp such as an incandescent or fluorescent lamp. It will be easily understood that the integration of such light source and the aforementioned photosensor 3304 on a same chip is extremely difficult.

Also there is required an additional optical system for guiding the light from the above-mentioned light source 3301 to the object 3302, and this increases the volume of the entire system.

Also the system including the optical system 3303, generally involving the imaging process, requires a dimension several times as large as the focal length of the lens contained in the optical system 3303. Such increase in the dimension of the system is never desirable, though the extent of such increase is dependent on the system.

Also in terms of the cost, the III–V semiconductor device, such as Ga—As device, is more expensive in comparison with the Si-based semiconductor device. Besides the cost increase of the system, the presence of a non-essential additional optical system should be avoided.

SUMMARY OF THE INVENTION

An object of the present invention is to provide optical equipment including a sight line detecting mechanism while attaining compactization, weight reduction and cost reduction, and an image display device and a semiconductor device usable advantageously therein.

Another object of the present invention is to provide an image display device enabling power saving, suppression of unnecessary heat generation, compactization of the entire device and designing with electric power saving, an optical equipment including such image display device.

Still another object of the present invention is to provide an optical equipment not requiring additional light source and/or photosensor for the detection of the line of sight, and an image display device advantageously usable therein.

Still another object of the present invention is to provide an image display device capable of detecting the line of sight without additional drive means and/or optical system.

Still another object of the present invention is to provide a semiconductor device enabling compactization and cost reduction.

Still another object of the present invention is to provide an optical equipment, provided at least with image display means, a light source for illuminating said image display means, light-receiving means for receiving the light, reflected by the eye of the observer, of said image display means, and calculation means for calculating the line of sight of said eye of the observer based on the output of said light-receiving means, wherein at least a part of the illuminating light from said light source is utilized as the illuminating light for illuminating said eye of the observer.

Still another object of the present invention is to provide an image display device provided with a rear light source and image display means for effecting display by passing the light from said rear light source through plural pixels, wherein the light from said light source contains a visible spectral component and a longer wavelength component outside the visible spectral region.

Still another object of the present invention is to provide an image display device provided with a rear light source and image display means for effecting display by passing the light from said rear light source through plural pixels, wherein said image display means includes a light-receiving unit.

Still another object of the present invention is to provide a semiconductor device in which a Si-containing light-emitting element and a light-receiving element are formed on a same chip, and an image display device and an optical equipment including such semi-conductor device.

DESCRIPTION OF THE PREFERRED EMBODIMENTS

Figure 1:
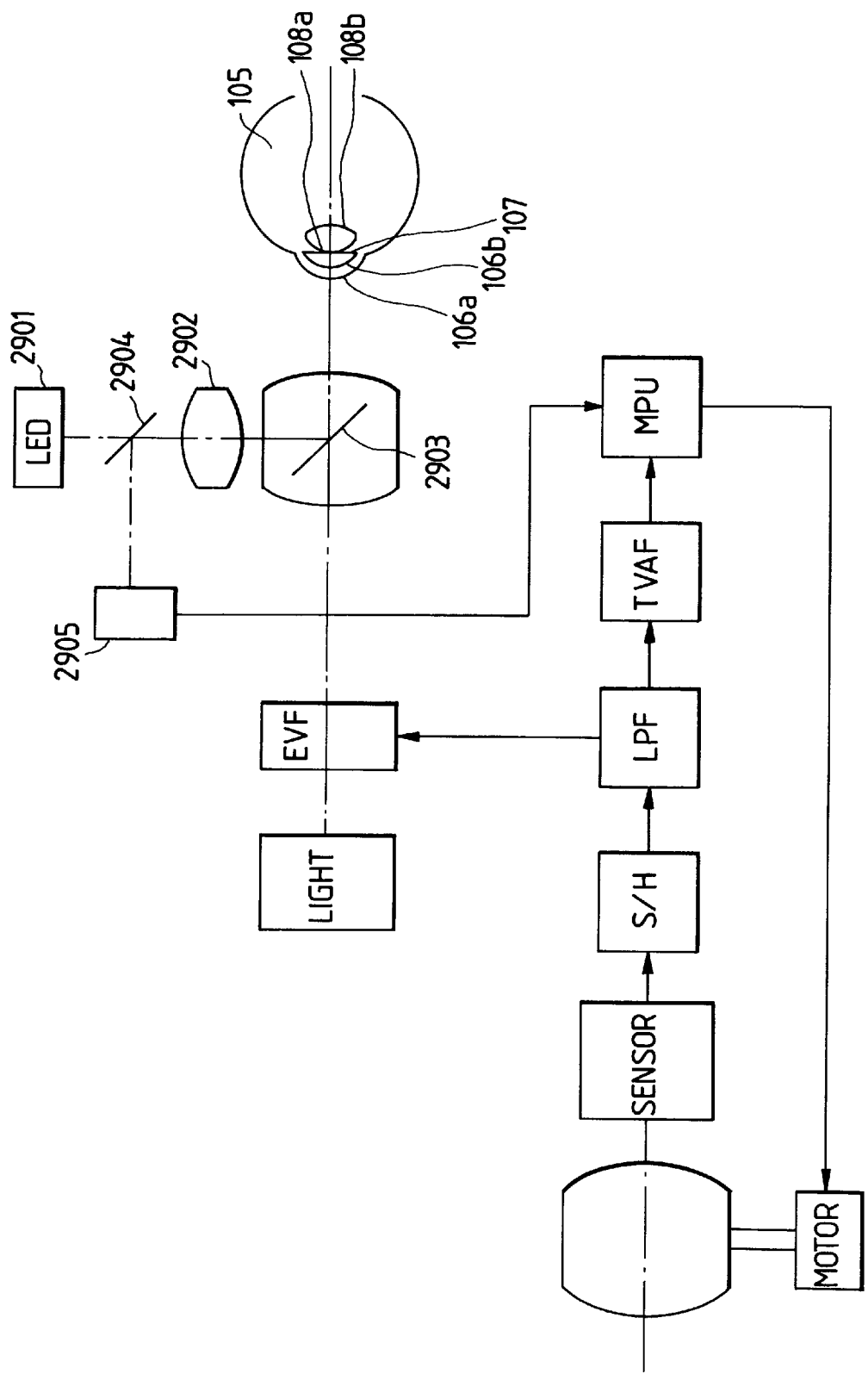
FIG. 1 is a schematic view showing a sight line detecting mechanism.
Figure 2:
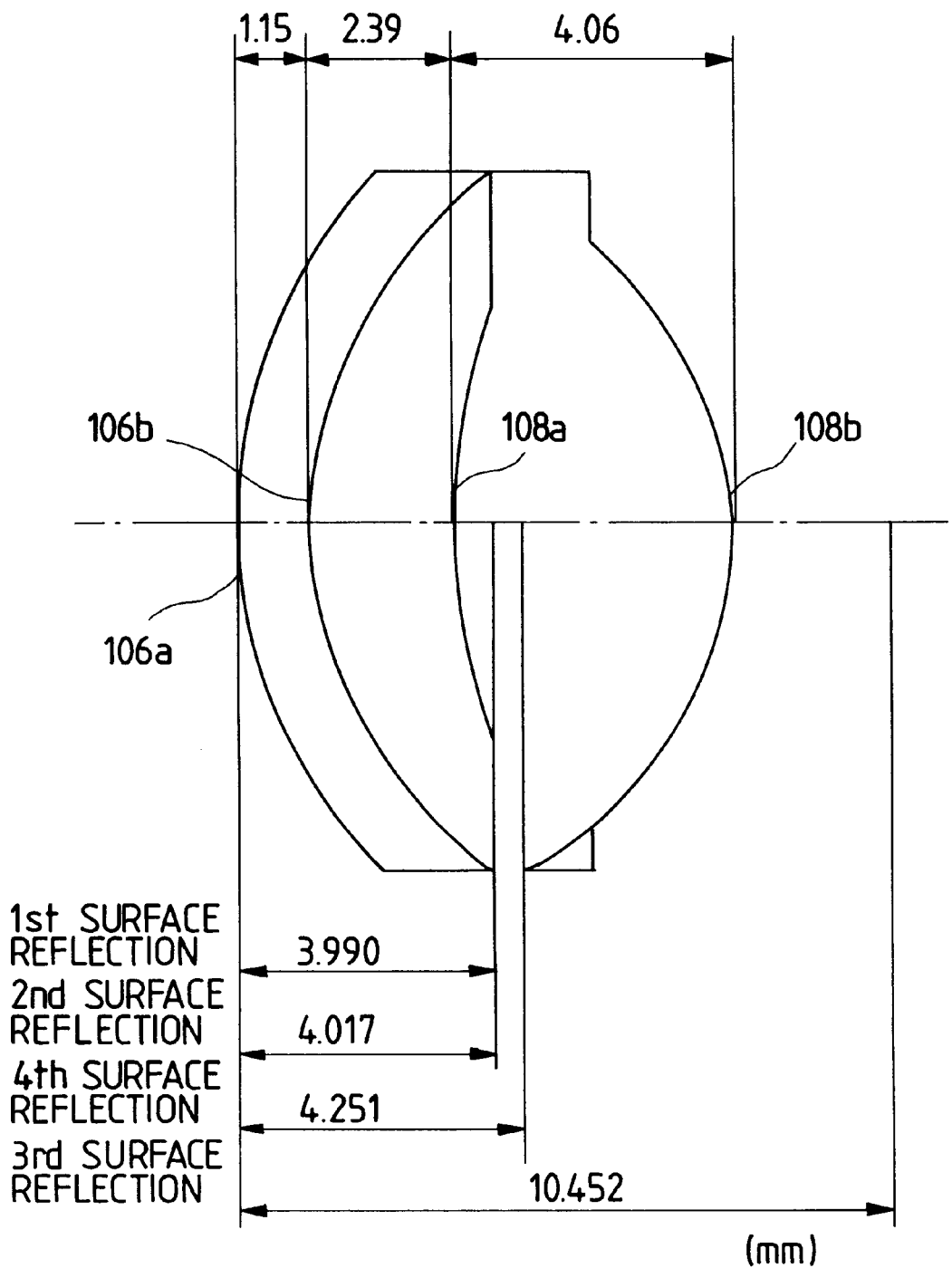
FIG. 2 is a view showing reflected images (Purkinje's images) at different interfaces of the eyeball.

In short, the above-mentioned drawbacks can be resolved and the above-mentioned objects can be attained by using the light source for the image display means also as the light source for the detection of the line of sight, and/or forming a light-receiving unit for the detection of the line of sight within the image display means.

Also the above-mentioned drawbacks can be resolved and the above-mentioned objects can be attained by forming the light-emitting unit and the light-receiving unit within a chip.

In the following, the present invention will be clarified in detail by preferred embodiments thereof, with reference to the attached drawings.

It is to be noted, however, that the present invention is naturally not limited to the following embodiments but is subject to various modifications and combinations of the following embodiments, within the scope and spirit of the present invention.

Embodiment 1

At first there will be explained the function of detection of the line of sight in the image device of the present invention, with reference to the schematic view of the optical equipment shown in FIG. 6.

The light beam from a rear light source 101 of a liquid crystal display panel 102 enters an eyeball 105, through an eyepiece lens 103. A part of the light reflected by the front face 106a and rear face 106b of the cornea, and the front face 108a and rear face 108b of the lens of the human eye proceed close to the original optical axis, then partly separated by a light splitter 104, and is focused by a condenser lens 109 onto a photoelectric converting device 110. The electric output thereof is supplied through an output line 111 to a control circuit 112 constituting calculation means for detecting the line of sight, which is used as an auto focusing signal or a trigger signal for other functions. As will be understood from the foregoing, the common use of the rear light source also for the light source for sight line detection dispenses with the additional components such as an LED.

Figure 6:
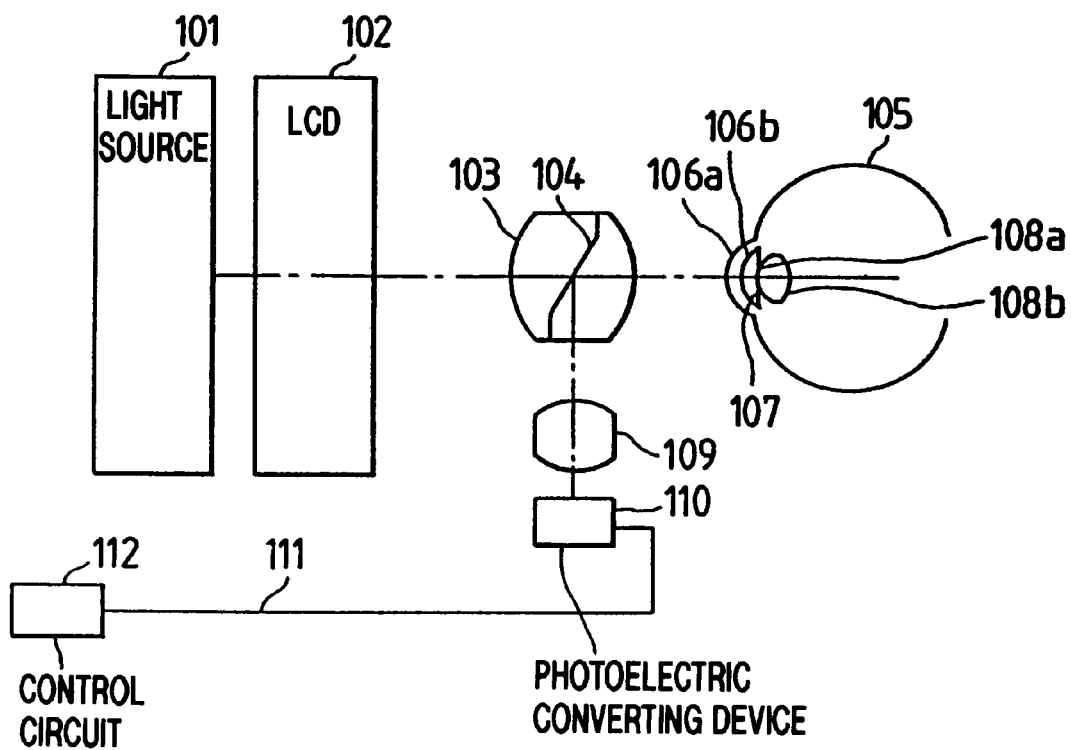
FIG. 6 is a schematic view showing an example of the optical equipment of the present invention.
Figure 7:
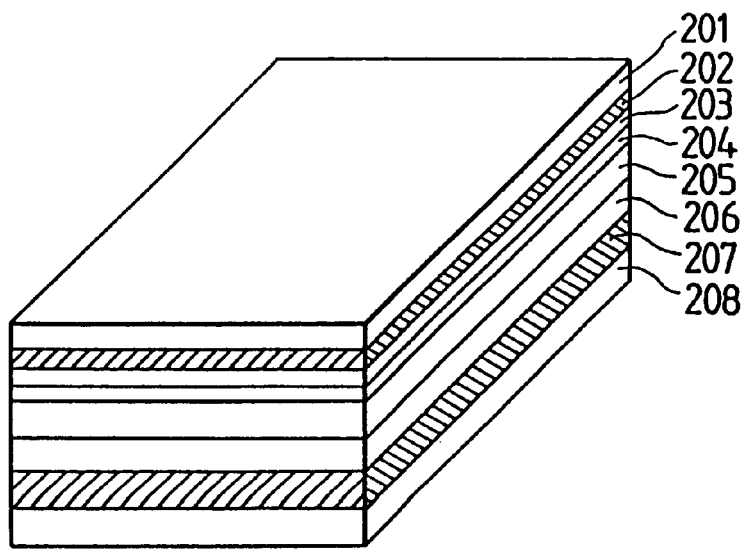
FIG. 7 is a schematic perspective view of an example of the image display means applicable in the present invention.

FIG. 7 is a schematic view showing an example of the preferred configuration of a liquid crystal display panel 102, constituting the active-matrix image display means usable in the optical equipment shown in FIG. 6. On a translucent glass substrate or a semiconductor substrate 207, there is formed a switching element layer 206 having thin film transistors (TFT) and a lower electrode. By on/off operation of the above-mentioned transistor of each pixel, in response to the image signal, there is generated a variation in the voltage applied to liquid crystal 205 sandwiched between the upper electrode 204 and the lower electrode. The liquid crystal twists the optical path depending on the applied voltage, thus generating a light-transmitting state and a light-intercepting state. White and black states can be distinguished to the human eyes, by means of polarizing filters 201, 208 adhered on both sides of the panel. Recently color liquid crystal display devices, having a color filter layer 203 utilizing dyes, are also rapidly becoming popular. As shown, glass substrate 202 is positioned between filter 201 and layer 203.

Figure 8A:
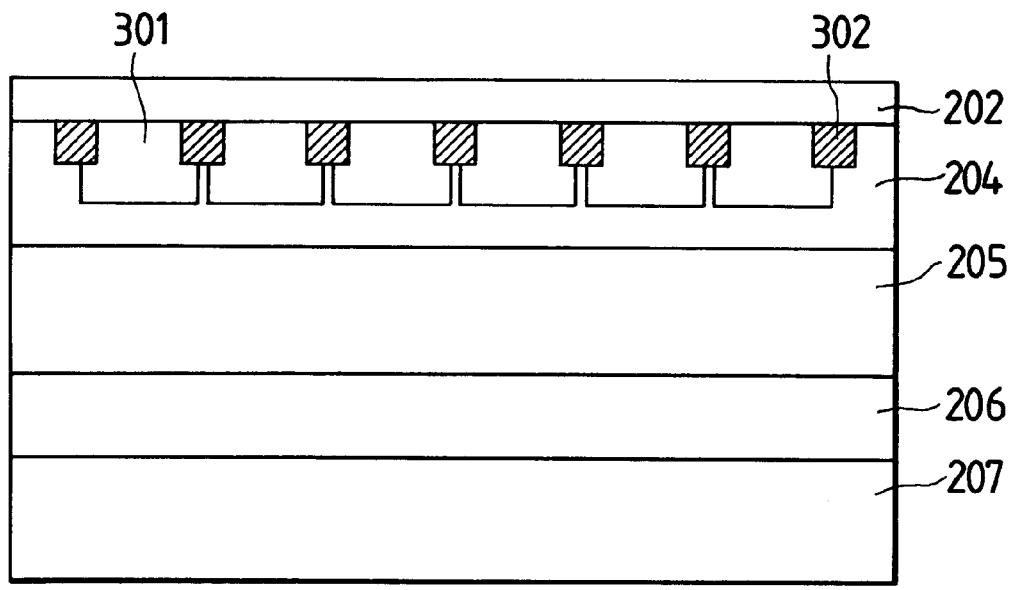
FIGS. 8A, 10, 12 and 13A are schematic cross-sectional views of image display means.
Figure 8B:
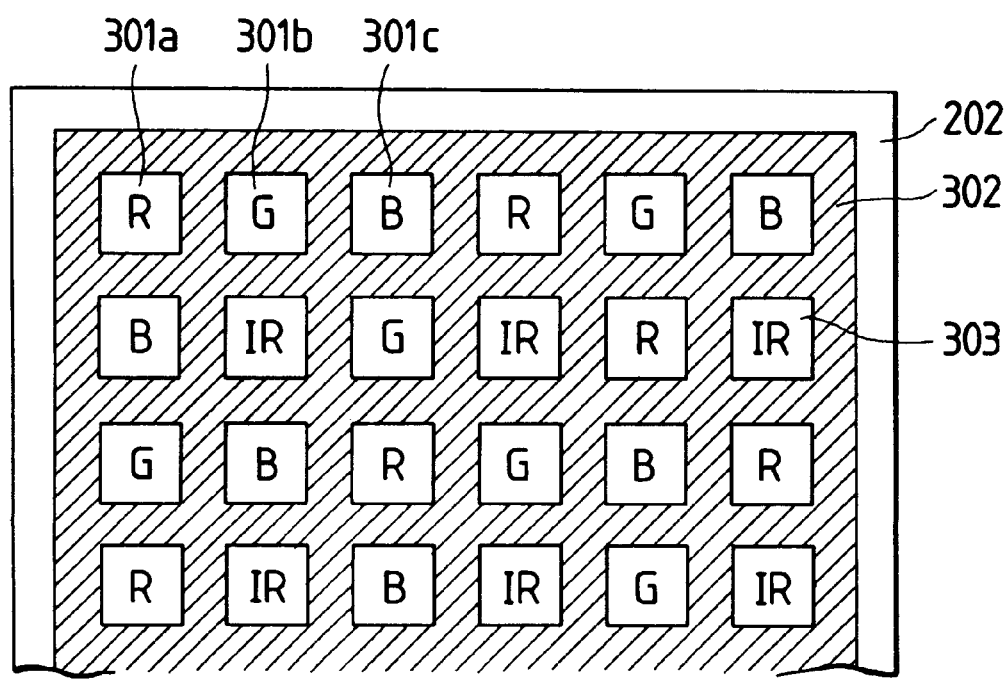
FIGS. 8B and 13B are schematic plan views of image display means.

FIGS. 8A and 8B are respectively a schematic cross-sectional view and a schematic plan view of the color filter layer 203 in magnified manner. In the present embodiment, so-called additive color filters 301a, 301b, 301c of R (red), G (green) and B (blue) are formed in chequer-board pattern, with the element isolation area formed with a black matrix 302. In addition, one in every four pixels is composed of an IR (infrared or near-infrared transmitting) filter 303, for transmitting the illuminating light for the detection of the line of sight. Such IR pixel is formed in every four pixels in the present embodiment, but such configuration is merely for the convenience of illustration, and the desired function can be sufficiently attained by one pixel in a larger number of pixels, for example in every 20 to 100 pixels.

Figure 9:
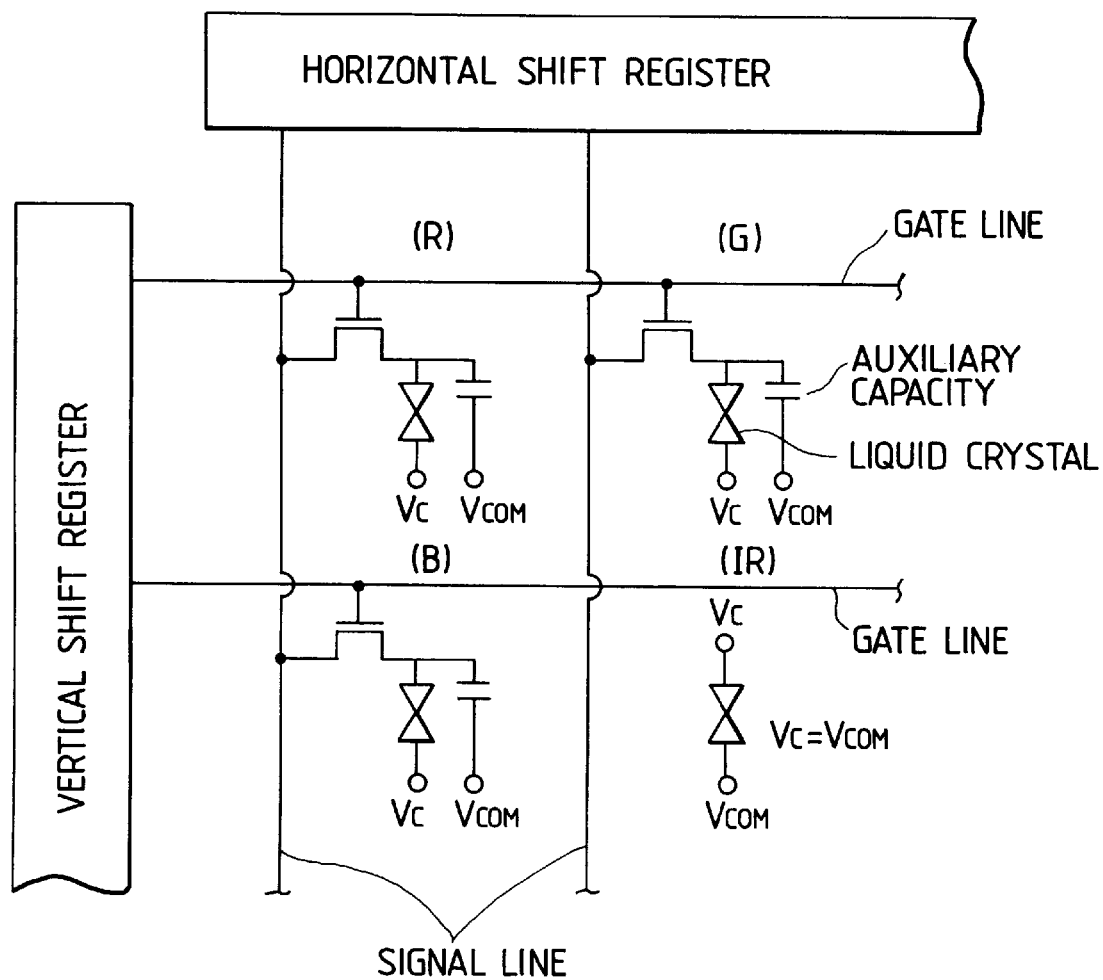
FIGS. 9, 11, 14, 15, 18, 19, 21 and 23 are circuit diagrams showing examples of the driving circuit of the present invention.

FIG. 9 is an example of the equivalent circuit of the switching element layer 206, for driving 4 pixels among the pixels shown in FIG. 8B. Since the IR pixel preferably transmits the light constantly regardless whether the image information is white or black, in the normally-white liquid crystal display panel which transmits the light when a zero voltage is applied to liquid crystal $R_1$ between the pixel electrode and the counter electrode, as in the present embodiment, there is adopted, for example, a condition $V_C \approx V_{COM}$. However, $V_C$ and $V_{COM}$ may be selected at different levels within an extent that the liquid crystal shows a high transmittance and does not change this state.

Figure 10:
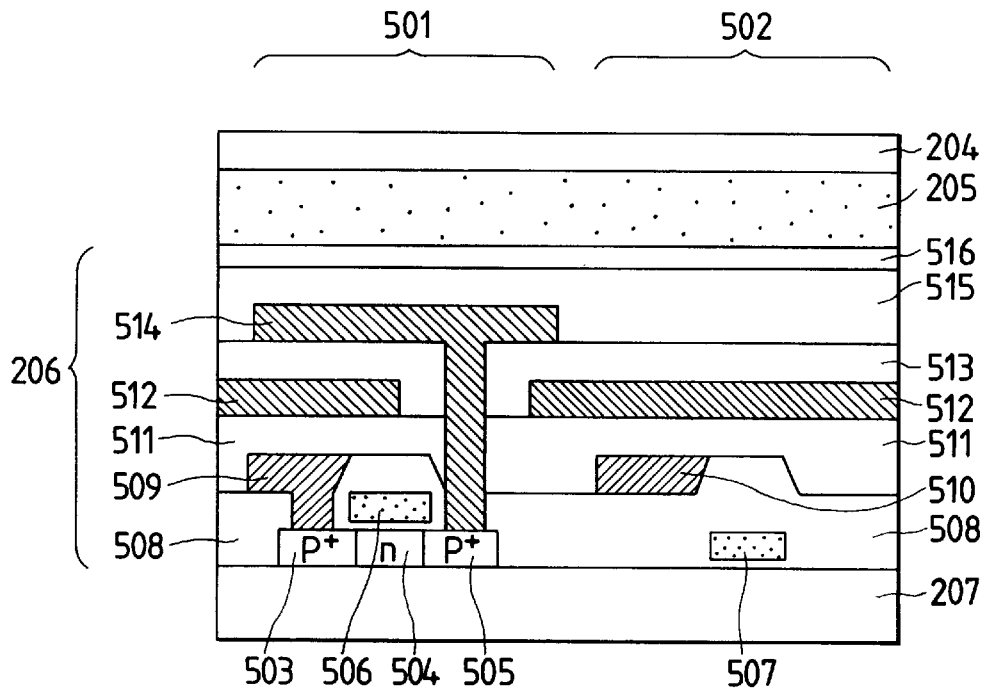

The cross section of a pixel is shown, in larger details, in FIG. 10. Within an effective pixel 501 for display, there is provided a transparent pixel electrode 514, connected to a drain area 505 of a transistor having a source area 503, an n-type active area 504, a drain area 505 and a gate electrode 506, in opposed manner to an upper electrode 204 thereby applying a voltage to the liquid crystal 205. The cross-section also illustrates a polysilicon gate 507, an element isolating insulating film 508, metallic electrodes 509 and 510, interlayer insulating film 511, and orienting film 516. Also an auxiliary capacitance for improving the image rendition and eliminating the flicker is formed by the capacitative coupling between another transparent electrode 512 and the transparent pixel electrode 514. On the other hand, the infrared transmitting pixel 502 does not have the transistor. In this area 502, a transparent electrode 512 and a counter electrode 204 are mutually opposed across the liquid crystal 205 and interlayer insulation films 513, 515 whereby the light is always transmitted. In relation to the equivalent circuit diagram shown in FIG. 9, $V_C$ is the potential of the upper (counter) electrode 204, and $V_{COM}$ is that of the transparent electrode 512.

It is desirable to select the gap thickness of the liquid crystal layer in the infrared transmitting area larger than that in the display area with the visible light, in order to suppress the reflection in the former thereby increasing the light transmittance. In this manner there can be achieved further improvement in the performance.

In summary, the sight line detecting system in this embodiment functions in the following manner. Among the light components emitted from the rear light source 101, the visible component displays an image according to the voltages controlled by the switching elements. At the same time, through the infrared transmitting filters of the IR pixels provided in a part of the image display means, the infrared or near-infrared light for the detection of the line of sight, of a constant intensity, enters the human eye from the liquid crystal display device. The light reflected by the eye is guided to the photoelectric converting device as explained before to effect the detection of the line of sight.

Figure 3:
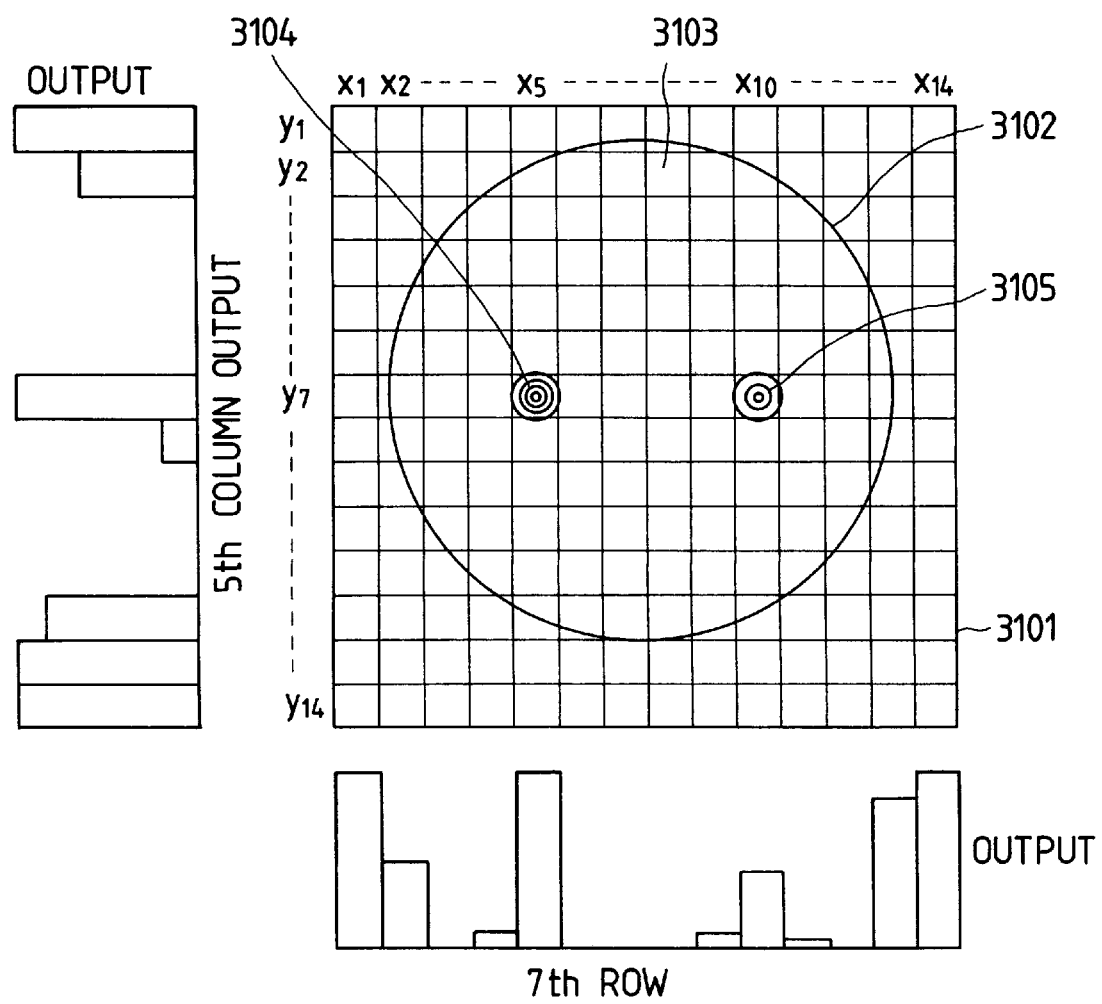
FIG. 3 is a view showing an example of the method for detecting the line of sight.
Figure 4:
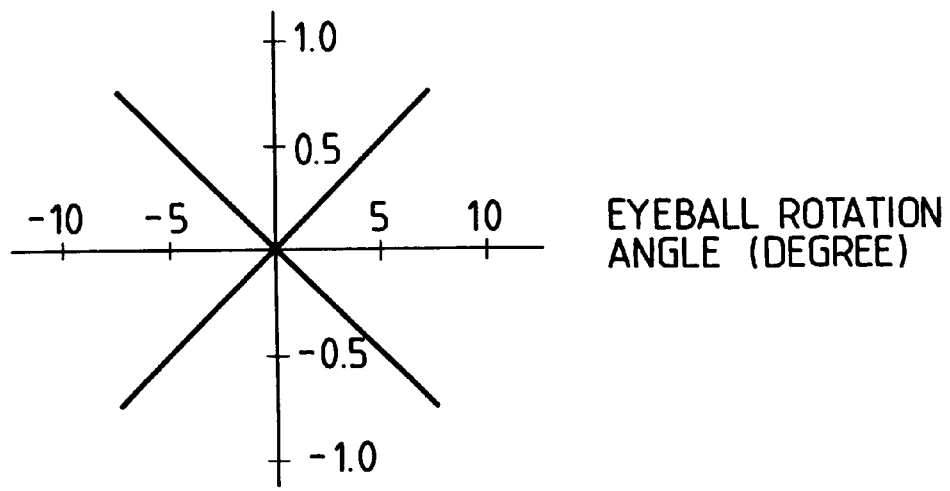
FIG. 4 is a chart showing the relationship between the amount of displacement of the Purkinje's image of a human eye and the rotation angle of the eyeball in a sight line detecting system.
Figure 5:
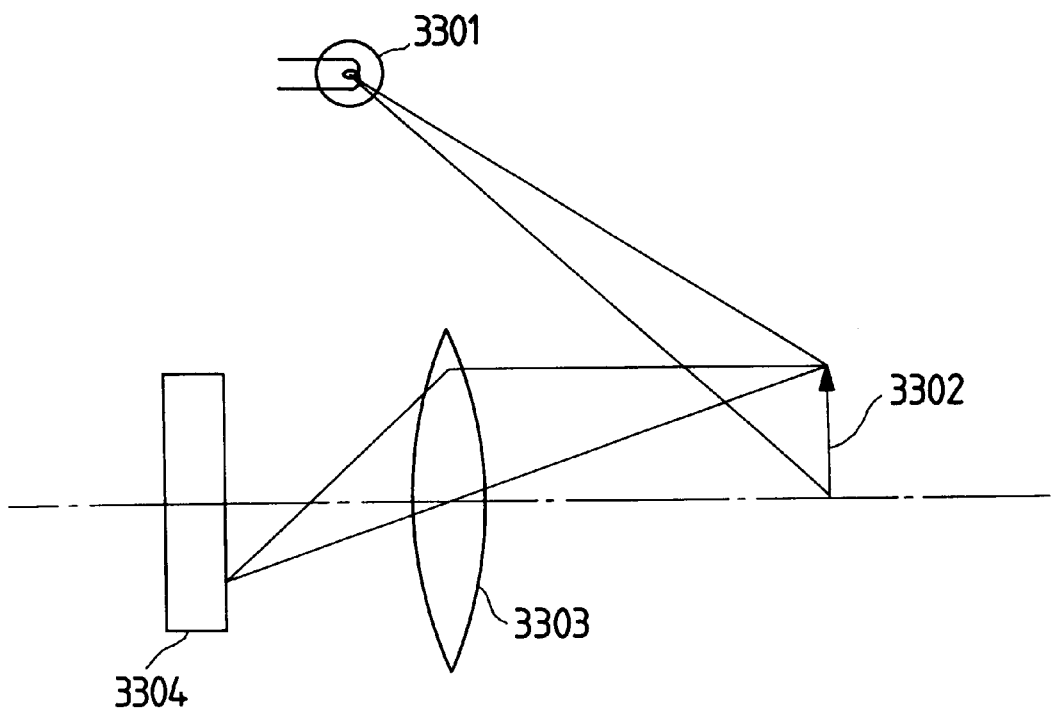
FIG. 5 is a view showing a signal processing system for the optical image.

The sight line detection is executed according to the principle and method explained before in relation to FIGS. 3 and 4.

In the present embodiment shown in FIG. 6, the photoelectric converting device, the control circuit etc. constituting the sight line detecting system are not essential and, for example, the configuration as shown in FIG. 1 may be adopted for this purpose.

Also the IR filter shown in FIGS. 8A and 8B may be replaced by visible-light cutting filter.

The present embodiment can achieve reduction in the size and weight of the entire equipment, since the additional light source for the sight line detection can be dispensed with. As a result, it contributes to the realization of optical equipment, such as a video camera, provided with the sight line detecting function and featured with a low cost and compactness.

Embodiment 2

This embodiment shows the configuration employing a normally black liquid crystal display panel which is black when without voltage application.

Figure 11:
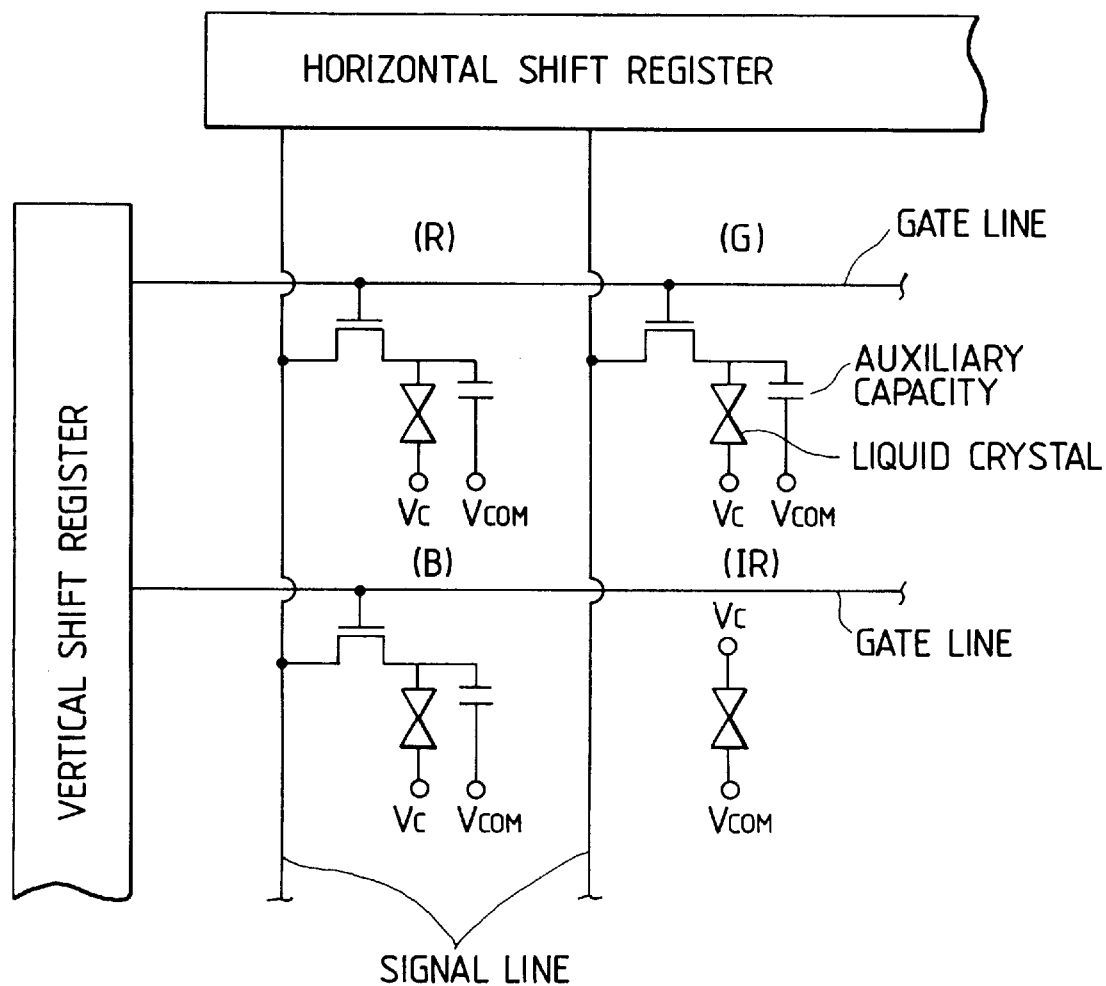

The configuration of the optical system of the sight line detecting system and the schematic structure of the liquid crystal display panel will not be explained as they can be the same as those shown in FIGS. 6 and 7. In circuit structure, as shown in FIG. 11, there is additionally required a potential line of $V_{SS}$ side in order to obtain a voltage $|V_{SS}-V_{COM}|>0$ to be applied to the liquid crystal of the infrared transmitting pixels (IR pixels).

Figure 12:
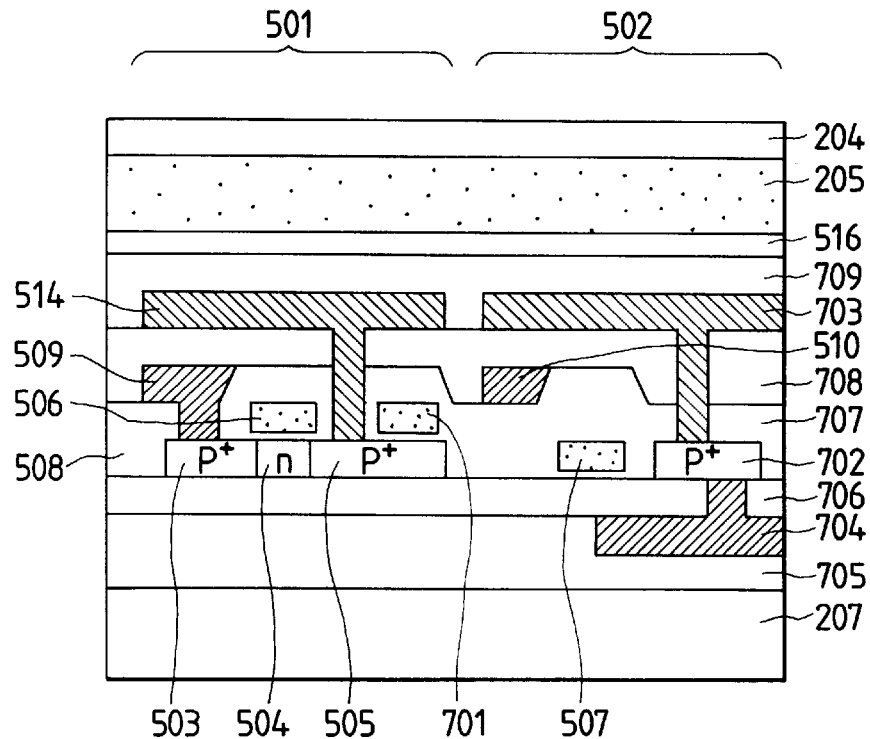

FIG. 12 is a cross-sectional view of the pixel. An effective pixel 501 for display is provided, as in the embodiment 1, with a transistor having a source area 503, an n-type active area 504, a drain area 505 and a gate electrode 506, an auxiliary capacitance formed by capacitative coupling between said drain area 505 and a polysilicon capacitor electrode 701, and a transparent electrode 514 electrically connected with said drain area 505. Also shown are polysilicon gate 507, element isolated insulating film 508, metallic electrodes 509 and 510 and orienting film 516. On the other hand, in an infrared transmitting pixel 502, a transparent electrode 703 receiving a potential $V_{SS}$ is connected to a rear electrode 704 through a $P^+$-silicon layer 702. In addition, insulating film 705, underlying insulation film 706, element isolating insulating film 707, first interlayer insulation film 708 and second interlayer insulation film 709 are shown. The IR pixels are given a common potential $V_{SS}$ by electrical connection of the rear electrodes 704 of all the infrared transmitting pixels. This connection is preferably achieved by transparent electrodes or relatively thin silicon or polysilicon, not hindering the transmission of the infrared light, but there may be employed metal wirings suitably positioned in superposing manner with the over-lying element isolation areas. For the application of the potential $V_{SS}$, there is preferably employed an AC voltage, in consideration of the deterioration of the liquid crystal. For example, there can be employed a voltage $V_{SS}=V_{COM}+5(V)$ in a half of the time for image display operation and a voltage $V_{SS}=V_{COM}-5$ (V) in the remaining half, so that $|V_{SS}-V_{COM}|$ becomes always constant.

Besides the present embodiment provides an advantage of arbitrarily selecting the light transmittance of the liquid crystal, by suitable selection of the potential of the rear electrode 704. Consequently there can be constructed a system of increased freedom, capable of independently adjusting the amount of light for the rear illumination and that for the sight line detection. Also the sight line detection can be stably achieved, irrespective of the displayed image, since the transmittance of the IR transmitting pixels can be controlled independently from the luminance of the displayed image.

In the present embodiment, the auxiliary capacitance is composed of the capacitative coupling between the polysilicon capacitor electrode 701 and the $P^+$ drain area 505, it may also be formed by the capacitative coupling between the transparent electrodes as in the embodiment 1.

Also the switching transistors are of p-MOS type, but n-type ones may also be employed without impairing the advantages of the present embodiment.

Embodiment 3

In the present embodiment there will be explained image display means in which the R, G, B color filters provided in so-called delta arrangement where the three color are positioned at the corners of a regular triangle, and the element isolation area is utilized for transmitting the illuminating light for the detection of the line of sight.

Figure 13A:
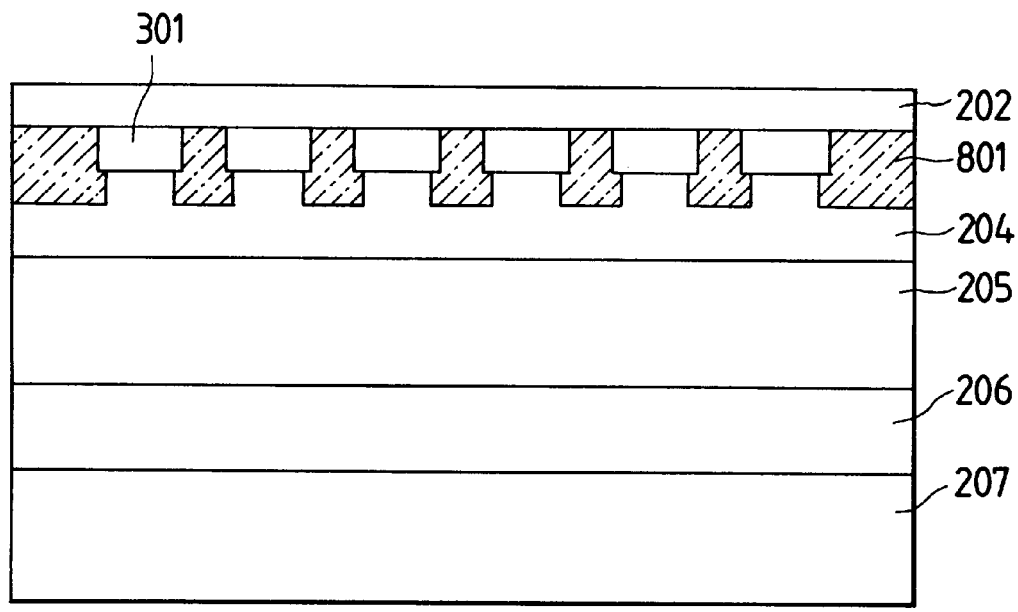
Figure 13B:
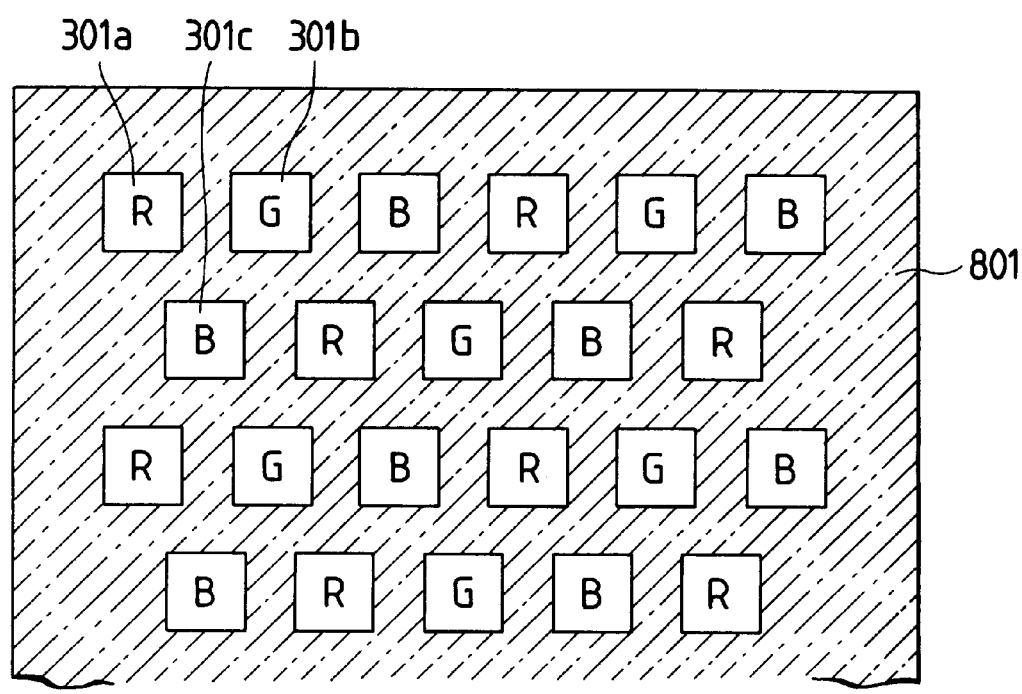

FIGS. 13A and 13B are respectively a schematic cross-sectional view and a schematic plan view of the color filter layer portion of the image display device of the present embodiment. As illustrated therein, the areas separating the R, G, B pixels for color display are covered with an infrared transmitting filter 801. On the other hand, the color pixels are positioned in the delta arrangement as explained above. In this arrangement, as shown in the schematic plan view in FIG. 13B, the pixels are displaced by 0.5 pixels every row, and the color of each filter is made different from those of the closest positioned filters, in order to avoid the appearance of a particular colored line in the diagonal direction. This delta arrangement can improve the image sharpness.

Figure 14:
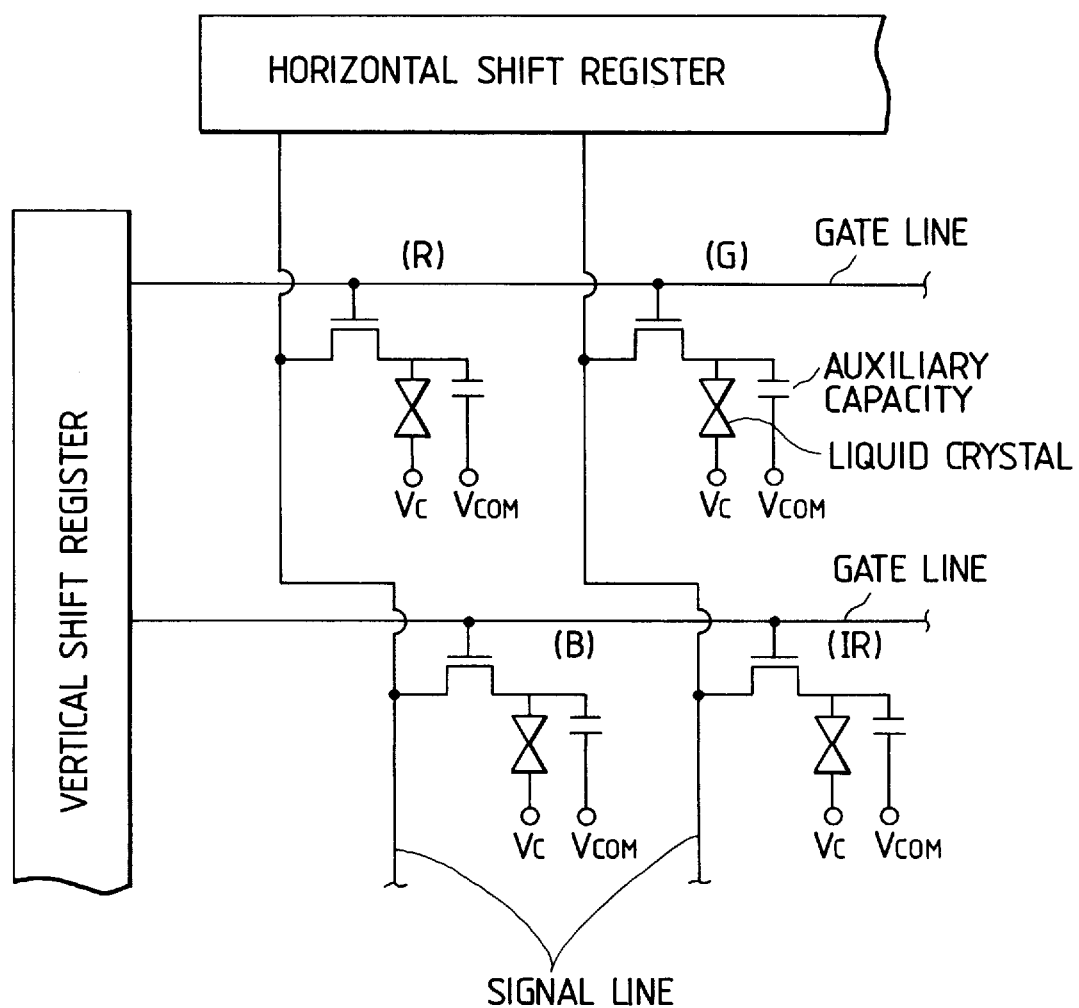

FIG. 14 is an equivalent circuit diagram of the switching element layer 206, for driving 4 pixels among those shown in FIG. 13B. As shown in FIG. 14, all the pixels can be utilized as effective pixels for image information display. In usual case there is required a black matrix 302 for mutually separating the pixels as shown in FIG. 8B but, in this embodiment, this black matrix is intentionally eliminated and the light is intentionally transmitted through the infrared transmitting filter in the element isolation area. These infrared transmitting filters, appear, to the human eyes, as opaque area. This configuration dispenses with the black matrix and provides the light for sight line detection, without sacrificing the image information even by a bit. As a result, the inexpensive image display device of high definition can be given the component for the sight line detecting function, without the addition of a new illuminating light source.

This embodiment is not limited to the liquid crystal device but is applicable also to any display device in which the pixel separating area can be made to transmit the infrared or near-infrared light. Also it is naturally applicable to any non-delta arrangement, without any variation in the configuration or characteristics.

In the following there will be explained preferred examples of the light source applicable to the present invention.

Figure 26:
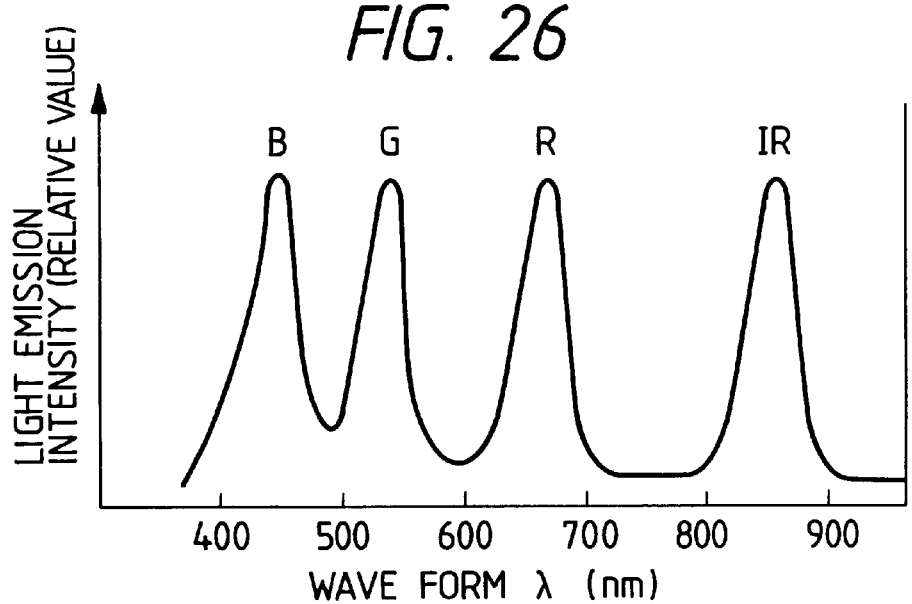
FIG. 26 is a spectral chart showing an example of the spectral distribution of the rear light source.

FIG. 26 shows an example of the light emission spectrum of the rear light source 101. This light source is for color display, including the blue (B) light having a peak around a wavelength 450 nm, the green (G) light having a peak around 550 nm and the red (R) light having a peak around 670 nm, and also emits infrared (IR) light having a peak in a region of 850–900 nm. The peak width of each of B, G or R color is selected narrower than that of each color in the spectral characteristics of the color filter of the liquid crystal display panel 102, whereby the displayed colors are determined by the characteristics of the light source, and there can be obtained stable and excellent color reproduction. In the present invention, the peak wavelength of the IR light is preferably longer than 850 nm so as to be insensible to the human eyes, and shorter than 950 nm so as to have a sufficient sensitivity when the detector is composed of silicon semiconductor.

Figure 27A:
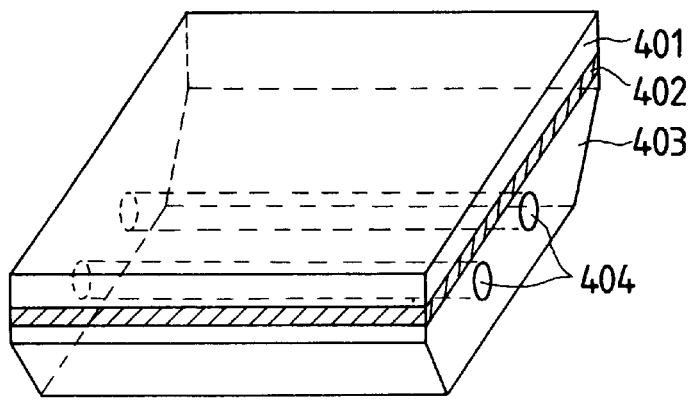
FIGS. 27A and 29A are schematic perspective views showing examples of the light source.
Figure 27B:
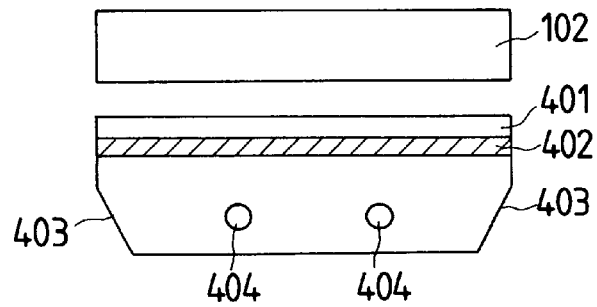
FIGS. 27B, 29B, 30 and 31 are schematic cross-sectional views showing examples of the light source.

FIGS. 27A and 27B are schematic views of the rear light source 101.

The light source can be, for example, a fluorescent lamp, a light-emitting diode, a cathode ray tube emitting light by an electron beam, a plasma display tube or an EL (electroluminescence) tube. The present embodiment employs a fluorescent lamp capable of emitting the R, G, B and IR lights by a single tube.

FIGS. 27A and 27B are respectively a schematic perspective view and a schematic transversal cross-sectional view. The light emitted in all directions from a fluorescent lamp 404 is collected by a reflector 403 to a light curtain 402, which is a semi-translucent reflector having aluminum deposition in such a manner that the reflectance is larger in areas close to the fluorescent lamp 404 constituting the light source and receiving a larger amount of light, and smaller in areas farther from the light source and receiving a smaller amount of light. The light reflected by the light curtain 402 is reflected by the reflector 403, then transmitted by the light curtain and scattered by a diffusing plate 401, thus being converted in uniform planar light and entering the liquid crystal display panel 102.

Figure 28:
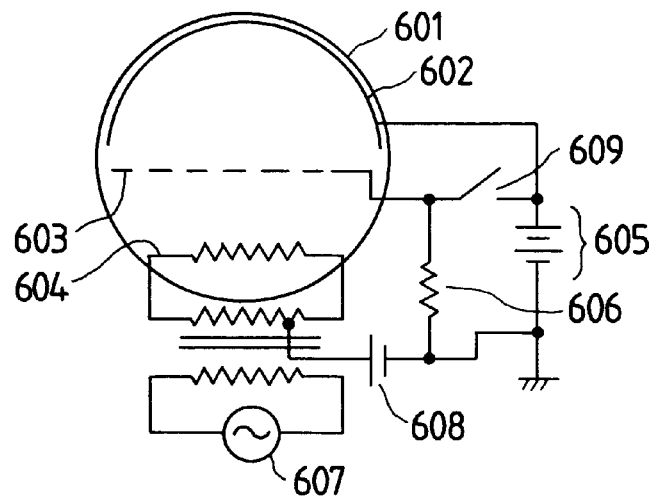
FIG. 28 is a schematic cross-sectional view showing the light-emitting source of the light source.

FIG. 28 shows the detailed structure of the fluorescent lamp 404. An anode 602, a grid 603 and a filament 604 sealed in a vacuum tube 601 are maintained at desired potentials by a bias source 605, a bias resistor 605, a bias resistor 606, an AC filament power source 607 and a cut-off bias source 608 provided outside. The circuit functions in the following manner. The filament 604 heated by the AC filament power source 607 emits thermal electrons, which are attracted by the grid 603 when a grid selecting switch 609 is turned on, and which pass through the gaps of the grid and collide with the anode 602. The anode 602 is coated with a fluorescent material which emits light when excited by the electron beam, and thus emits light.

In the present embodiment, there is employed a blend of four fluorescent materials of R, G, B and IR, in order to obtain a light-emission spectrum as shown in FIG. 26. The cut-off bias source 608 is provided to always maintain the filament 604 at a higher potential than the grid 603 when the grid selecting switch 609 is turned off, thereby suppressing unnecessary light emission in the off state.

Figure 29A:
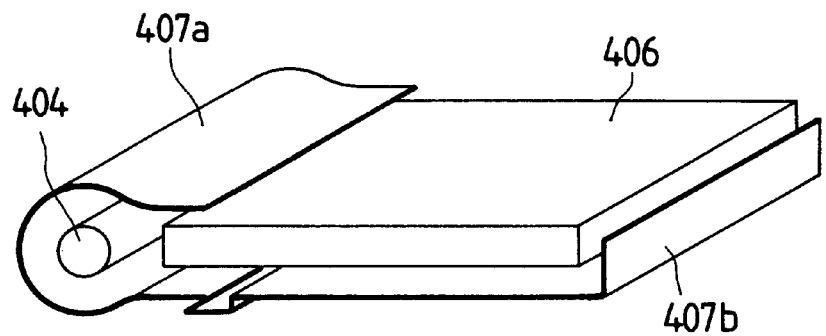
Figure 29B:
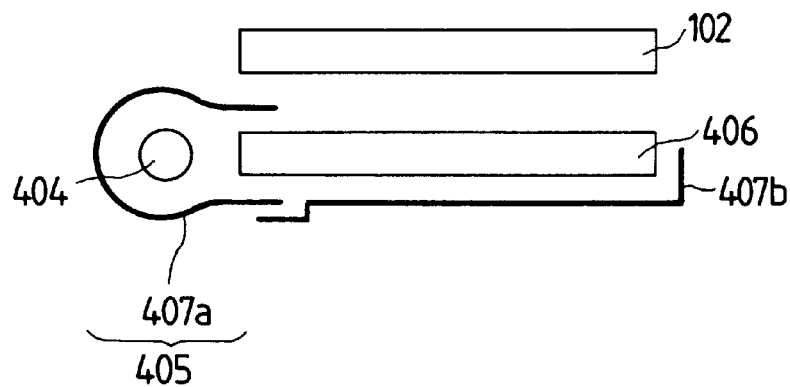

In the following there will be explained another example of the light source applicable in the present embodiment, with reference to FIGS. 29A and 29B. FIG. 29A shows a planar light source having a light condensing unit 405 at a side, wherein the light emitted from a fluorescent lamp 404 is guided by a reflector 407a to a light guide plate 406. The light scattered in the light guide plate is emitted uniformly upwards. A reflector 407b is provided in order to effectively utilize the downward leaking light. The reflectors 406a, 407b are made of a material reflecting not only the visible light but also the IR light almost completely. For improving the uniformity, there is preferably provided another set of the fluorescent lamp and the reflector at the other side.

Such configuration allows to compactize the light source and the entire equipment, in comparison with the aforementioned structure.

In the following there will be explained another example of the light source applicable in the present invention, with reference to schematic cross-sectional views shown in FIGS. 30 and 31.

The light source of this embodiment is featured by incorporating a visible light emitting lamp 904 and an infrared light emitting lamp 905 in the light source unit, in independently controllable manner. FIGS. 30 and 31 are schematic cross-sectional views, respectively showing a case applied to the light source of a form explained in FIGS. 27A and 27B and a case applied to that explained in FIGS. 29A and 29B, and the functions of the components are the same as already explained. The lamps are naturally so positioned that the entire area of the liquid crystal panel 102 can be uniformly illuminated both by the visible light and by the infrared light. In FIG. 31, numerals 1001a, 1001b, 1001a represent reflectors.

Figure 30:
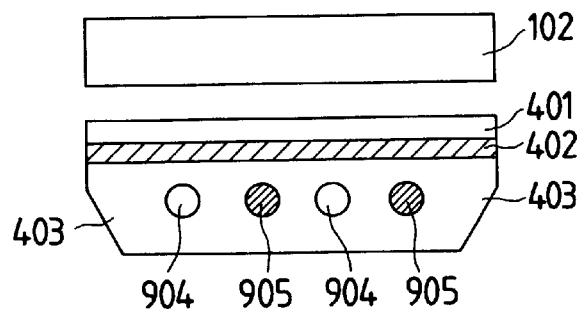
Figure 31:
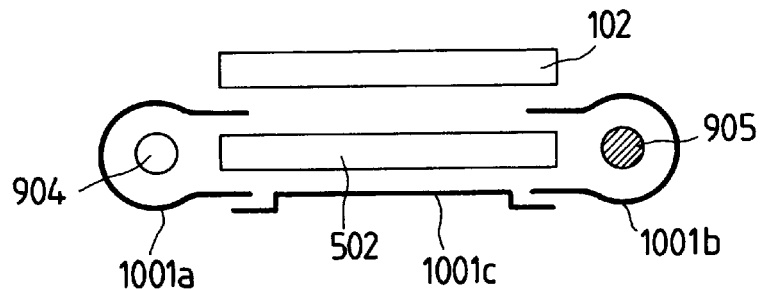

The configurations shown in FIGS. 30 and 31 provide the advantage that the amount of light of the visible light source for image display and that of the infrared light source for sight line detection can be independently controlled and can therefore be respectively optimized. More specifically, the amount of light of the visible light source can be regulated according to the intention of the observer or according to the intensity of the external light, while the amount of infrared light can be selected in optimum manner according to the sensitivity of the sight line detecting sensor, the optical designating etc. Consequently freedom in designing and practicality are increased in the entire equipment.

Naturally the range of the adjustment of the amount of light can be further extended by the combination of the transmittance control of the IR pixels of the image display device.

Also the configurations shown in FIGS. 30 and 31, not necessarily requiring to vary the transmittance in the IR pixels or in the IR transmitting area, allow to simplify the structure including the control system.

Furthermore, the present invention can be exploited without forming the IR filters anew, by suitably selecting the transmission characteristics of the R, G and B color filters.

Figure 32:
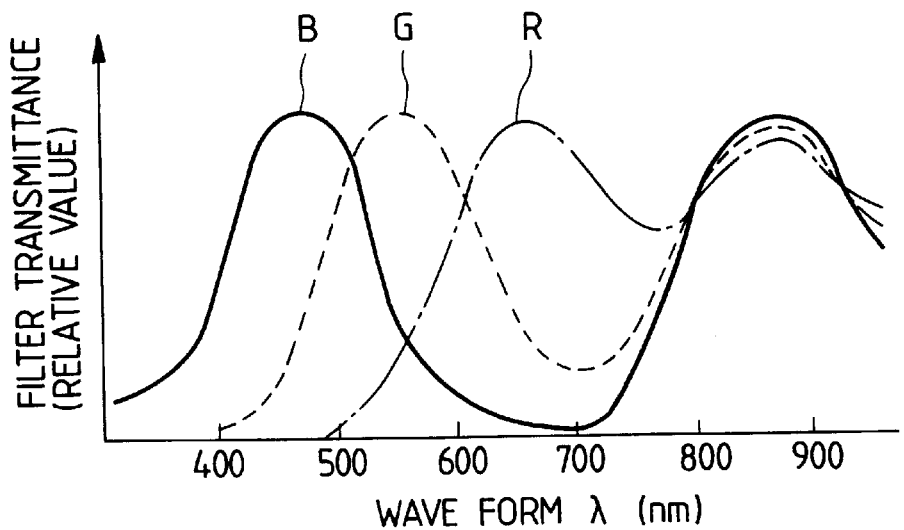
FIG. 32 is a spectral chart showing an example of the transmission characteristics of the filters.

More specifically, the filter configuration of the present embodiment may employ the IR filter shown in FIGS. 13A and 13B as the black matrix, and color filters of the transmission characteristics as shown in FIG. 32, representing the spectral transmittances of the R, G and B filters suitable for this example. In this example, the space between the color filters is covered with the black matrix 702, while each of all the pixels is covered with R, G or B filter and all the pixels are utilized for image display. However, the spectral characteristics of such filters transmits the light of infrared region (>80 nm) in any color, so that the infrared light for the detection of the line of sight is transmitted through all the pixels.

This embodiment is featured by a fact that the infrared light for the detection of the line of sight can be transmitted with a sufficient intensity, without any deterioration in the image quality, since all the pixels are used for image display.

In the present invention, there can be conceived the light sources of various forms and structures other than those shown in the foregoing embodiments, but such light sources are satisfactorily usable in the present invention as long as the light thereof contains sufficiently the wavelength component usable for the detection of the line of sight.

Also there can be conceived various arrangements of the R, G, B and IR filters, but any arrangement is acceptable as long as an area for effectively transmitting the IR light is secured on the display panel.

Embodiment 4

Figure 40:
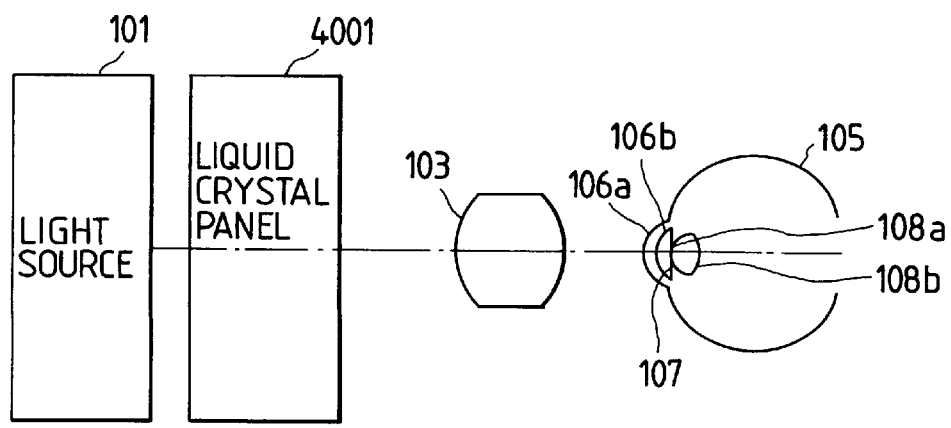
FIG. 40 is a schematic view showing an example of the optical equipment of the present invention.

In the following there will be explained an embodiment in which the light-receiving device for the sight line detection is integrated with the liquid crystal display panel. FIG. 40 schematically shows an optical equipment of the present embodiment, including a liquid crystal display panel 4001 integrated with the light-receiving device. Components equivalent to those in FIG. 6 are represented by same numbers.

Figure 15:
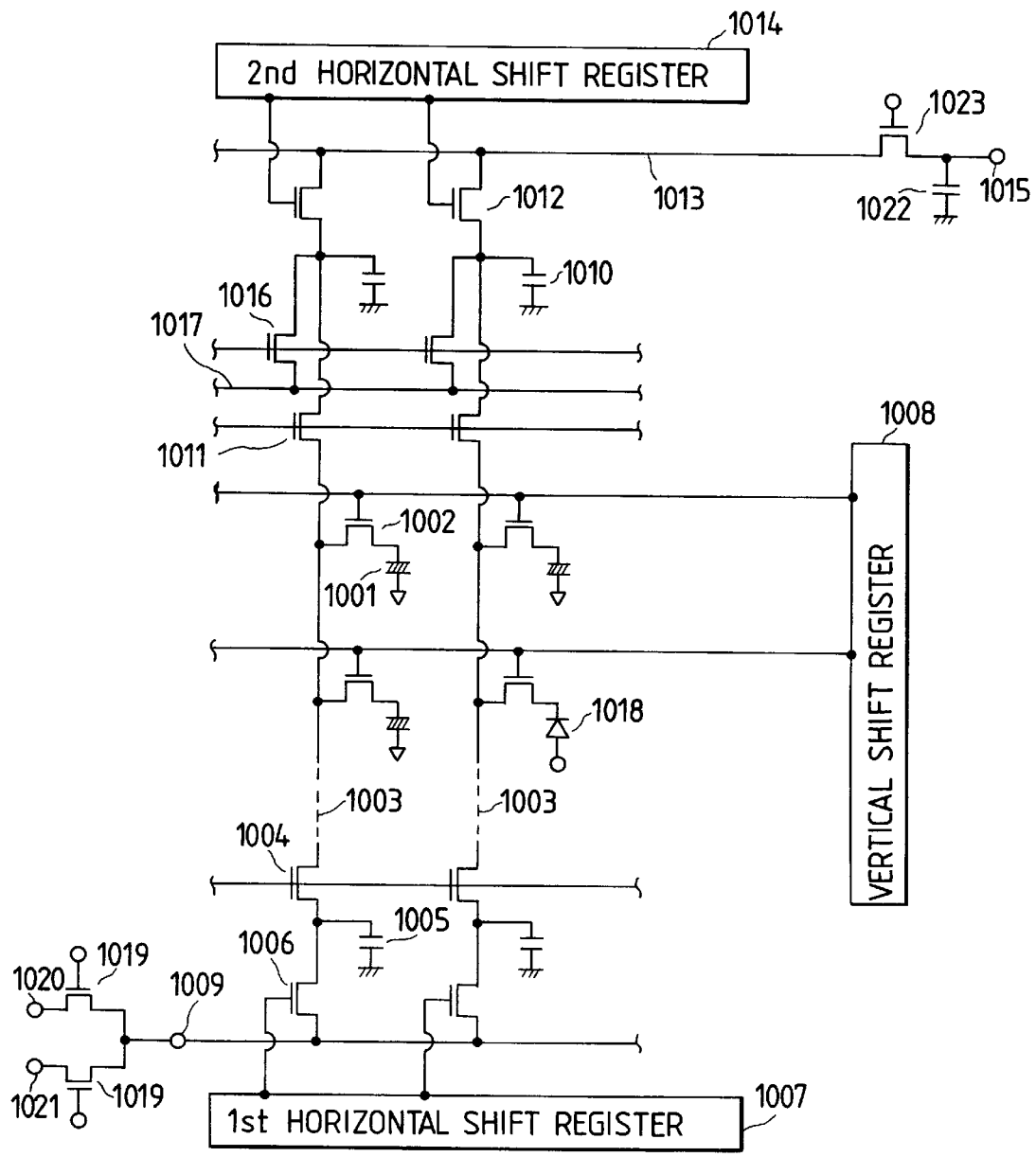

FIG. 15 shows an example of the preferred circuit structure of the image display device of the present embodiment, wherein shown are a capacitance 1001 formed by the liquid crystal cell; a switching TFT (pixel TFT) 1002 for applying a signal potential to said liquid crystal cell or for connecting a photoelectric converting element 1018 such as a photodiode with a signal line 1003; a 1st transfer gate 1004; a 1st buffer capacitance 1005; a switching TFT 1006 for accumulating an external signal pulse in the corresponding 1st buffer capacitance 1005; a 1st horizontal shift register 1007 for driving the switching TFT's 1006; a vertical shift register 1008 for driving the switching TFT's 1002; an external signal input terminal 1009; a 2nd buffer capacitance 1010; a 2nd transfer gate 1011 for accumulating the sensor output of a photoelectric converting element 1018 in the corresponding 2nd buffer capacitance 1010; a switching TFT 1012 for releasing the sensor output signal of the photoelectric converting element, retained in the 2nd buffer capacitance 1010, in successive manner to an output line 1013; a 2nd horizontal shift register 1014 for driving the switching TFT's 1012; an output terminal 1015 for the sensor output signal; a resetting TFT 1016 for resetting the 2nd buffer capacitance 1010; a resetting signal line 1017; a selecting transistor 1019; a 2nd reset signal input terminal 1020; an image signal input terminal 1021; a sampling capacitor 1022; and a sampling transistor 1023.

Though not illustrated, an auxiliary capacitance may be provided to each pixel for improving the image quality of the panel.

As a specific example of the functions of this circuit, there will be explained the drive of an active matrix device employing TN liquid crystal and provided with photodiodes, with reference to a timing chart shown (A) to (H) in FIG. 16.

Figure 16:
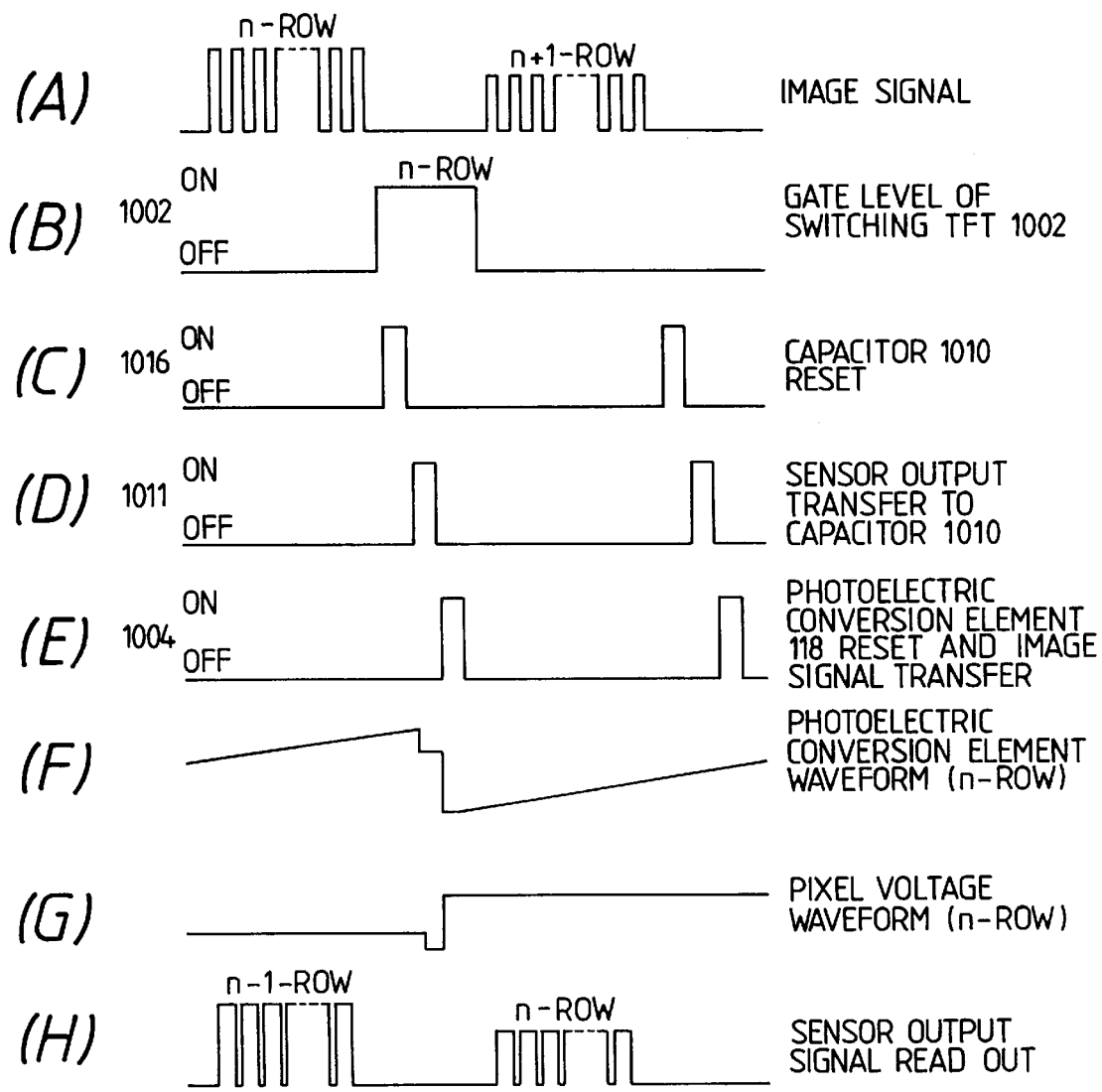
FIGS. 16, 20 and 22 are timing charts showing the timings of functions.

At first, image signals of a line are entered in succession from the external signal input terminal 1009 (A) in FIG. 16). The 1st horizontal shift register 1007, driven by the pulses synchronized with the image signals, turns on the switching TFT's 1006, thereby transferring the image signals of the pixels to the buffer capacitors 1005. In this operation, in the image signal of the buffer capacitor 1005 corresponding to the pixel having the photoelectric converting element 1018, a bit signal, corresponding to the reset signal of the photoelectric converting element, is transferred from the reset signal input terminal 1021, by the switching of the selecting transistor 1019. In the so-called blanking period after the signal transfer of the last bit of a line to the buffer capacitor 1005 and before the entry of the image signals of the next line to the buffer capacitors 1005, the pixel TFT's 1002 of a desired row are turned on (cf. (B) in FIG. 16). The resetting TFT's 1016 are turned on, thereby resetting the potentials of the 2nd buffer capacitors 1010 (cf. (C) in FIG. 16). Subsequently the resetting TFT's 1016 are turned off, and the 2nd transfer gates 1011 are turned on, thereby transferring the sensor outputs of the photoelectric converting elements 1018, detecting the reflected light from the eye of the observer, to the 2nd buffer capacitors 1010 (cf. (D) in FIG. 16).

In these operations, if the photoelectric converting elements are non-amplifying elements such as photodiodes, the signal amplitude transferred to the 2nd buffer capacitor 1010 is determined by the ratio of the capacitance of the photodiode accumulating the signal charge and the buffer capacitance 1010, becoming larger as the buffer capacitance 1010 is smaller in comparison with the photodiode capacitance. Also the signal amplitude at the sensor signal output terminal 1015 is determined by the ratio of the buffer capacitance 1010 and the capacitance attached to the signal line 1013, becoming larger as the buffer capacitance increases in comparison with the capacitance associated with the signal line 1013. Consequently, the buffer capacitance 1015 is preferably so determined as to maximize the signal amplitude given at the sensor signal output terminal 1015. The buffer capacitance 1010 may be provided by an independent capacitor as illustrated, or may be composed of a parasite capacitance of the wirings.

After the transfer of the sensor output signals, the 2nd transfer gates 1011 are turned off, while the 1st transfer gates 1004 are turned on, thereby transferring the image signals, transferred to the 1st buffer capacitors 1005, to the respective pixels. At the same time a reset signal is supplied to the photoelectric converting elements 1018, thereby resetting the sensor potentials (cf. (E) in FIG. 16). These operations of sensor output signal read-out, image signal transfer to the pixels and resetting of the photoelectric converting elements, are executed during the blanking period.

(F) in FIG. 16 shows an example of the variation in the potential of the photoelectric converting element 1018 in the above-explained operations. From the resetting operation in the blanking period at a timing shown in (E) in FIG. 16 to the turning-on of the switching TFT of the same pixel after a frame period, the photoelectric converting element 1018 accumulates carriers generated by light. When the pixel TFT 1002 and the 2nd transfer gate 1011 are turned on at the timing shown in (D) in FIG. 16, the accumulated signal charge is transferred to the 2nd buffer capacitor 1010, whereupon the potential of the photoelectric converting element 1018 reaches a value determined by the capacitance division ratio with the 2nd buffer capacitor 1010. Then the photoelectric converting element 1018 is reset and start the accumulation of the signal corresponding to the next frame.

Also (G) in FIG. 16 shows the variation in potential of a display pixel in the liquid crystal display device. The image signal voltages are transferred by every line at the timing shown in (E) in FIG. 16, and are retained for a frame period. According to these signal voltages, the transmittance of the liquid crystal cells varies, thus displaying an image of desired density.

The application method of the image signals has been proposed in various manners, such as frame-inverted drive, 1H-inverted drive, dot-inverted drive in order to prevent deterioration of the liquid crystal by the DC current component, but the present invention is not limited to any of such signal application methods. The sensor out signals, transferred to the 2nd buffer capacitors 1010 during the blanking period, are released to the signal output terminal 1015 by the switching TFT's 1012 turned on by the 2nd horizontal shift register 1014 within a horizontal scanning period. Depending on the arrangement of the photoelectric converting elements, the image signal retained in the adjacent display element may also be read in the buffer capacitor 1016. In such case, it is possible to obtain the sensor output signal only, by sampling of the sampling capacitor 1022 in synchronization with the timing of signal transfer from the photoelectric converting element. Otherwise the sensor output signal alone may be taken out by a switch turned on and off by the shift register 1014.

The operation of the shift register 1014 may be synchronized or not with that of the shift register 1007. It is also possible to synchronize the shift registers 1014 and 1007, and to drive them with same clock signals. Also the sensor output signal read-out unit 1010–1017 may be connected alone to the signal lines 1003 connected to the photoelectric converting elements 1018, or to all the signal lines to read the sensor output signals and to extract the sensor signals by the signal processing after the signal output terminal 1015.

Figure 17:
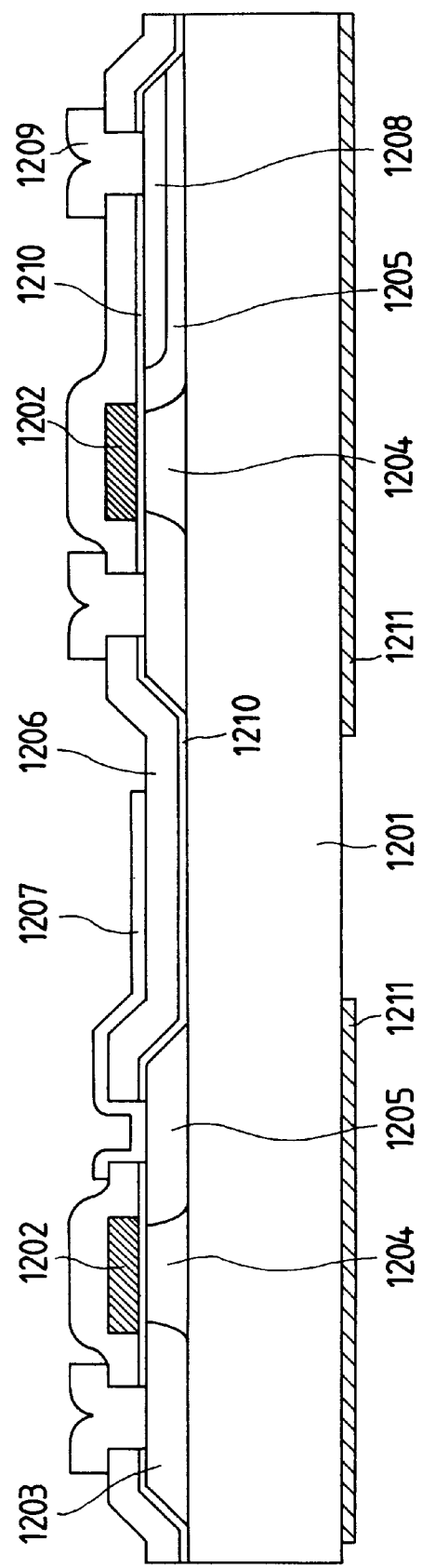
FIGS. 17, 24 and 25 are schematic partial cross-sectional views of image display means.

FIG. 17 is a schematic cross-sectional view of an image display pixel and a photoelectric converting element employed in the present embodiment, wherein shown are a transparent insulating substrate 1201; a gate electrode 1202 of the switching TFT 1002, connected to the horizontal line for driving this device; a source area 1203 of the switching TFT 1002, connected to the vertical line (signal line 1003); a channel area 1204 of the switching TFT; a drain area 1205 of the switching TFT 1002; an interlayer insulation film 1206; and an insulation layer 1210, partly functioning as a gate insulation layer for electrical insulation between the gate electrode 1202 and the semiconductor layers (1203, 1204, 1205). The semiconductor layers 1203, 1204, 1205, 1208 constituting the TFT and the photoelectric converting unit are preferably masked from the light with a light masking means 1211, in order that the light entering from the substrate side does not reach these semiconductor layers.

In the image display pixel, the drain area 1205 is connected, through a contact hole formed thereon, to a transparent pixel electrode 1207 composed for example of ITO (indium tin oxide). In response to the signal applied to the transparent pixel electrode 1207, the liquid crystal thereon varies in transmittance, thereby displaying a desired image.

The light masking means should be provided at an optimum position, in consideration of the incident direction of the light. For example the masking means may be so positioned as to cover the lateral walls of the semiconductor layers, for achieving further effective light masking.

Also in the photoelectric converting element, the drain area 1205 contains therein a semiconductor area 1208 of the opposite conductive type, which is connected, through a contact hole formed thereon, to an electrode 1209.

At first, in the blanking period, a reset voltage is applied in such a manner that the drain area 1205 of the photoelectric converting element and the semiconductor area 1208 of the opposite conductive type are inversely biased. Then the switching TFT 1002 is turned off to maintain the drain area in the electrically floating state. A depletion layer is spread between the drain area 1205 and the semiconductor area 1208, and the photoexcited electron-hole pair, once caught in the depletion layer, is attracted by the electric field thereof, whereby either of the electron and the positive hole is dissipated at the electrode 1209 while the other is accumulated in the capacitance of the depletion layer to constitute the photo signal.

The structure of the photoelectric converting element is not limited to that explained above, but can be, for example, that utilizing a Schottky junction or employing a SiGe layer in one of the semiconductor layer, or a structure having a highly reflective film at the back of the device for improving the light utilizing efficiency. Also the photoelectric converting element need not necessarily be provided on a transparent substrate.

The structure and the driving method explained above:

(1) do not require the photoelectric converting elements, constituting the sensor for the sight line detection, separately from the image display device, thereby achieving compactization and cost reduction of the system; and (2) do not newly require the driving circuit for the sight line detecting sensor or enable significant simplification thereof, since the driving circuit for the image display device itself is used also for that of the sight line detecting sensor.

Naturally the photoelectric converting elements can be determined in number and in distribution within an extent not influencing the image quality, but such number and arrangement should be so determined to provide necessary and sufficient information on the line of sight, as the sensor for sight line detection.

Embodiment 5

Figure 18:
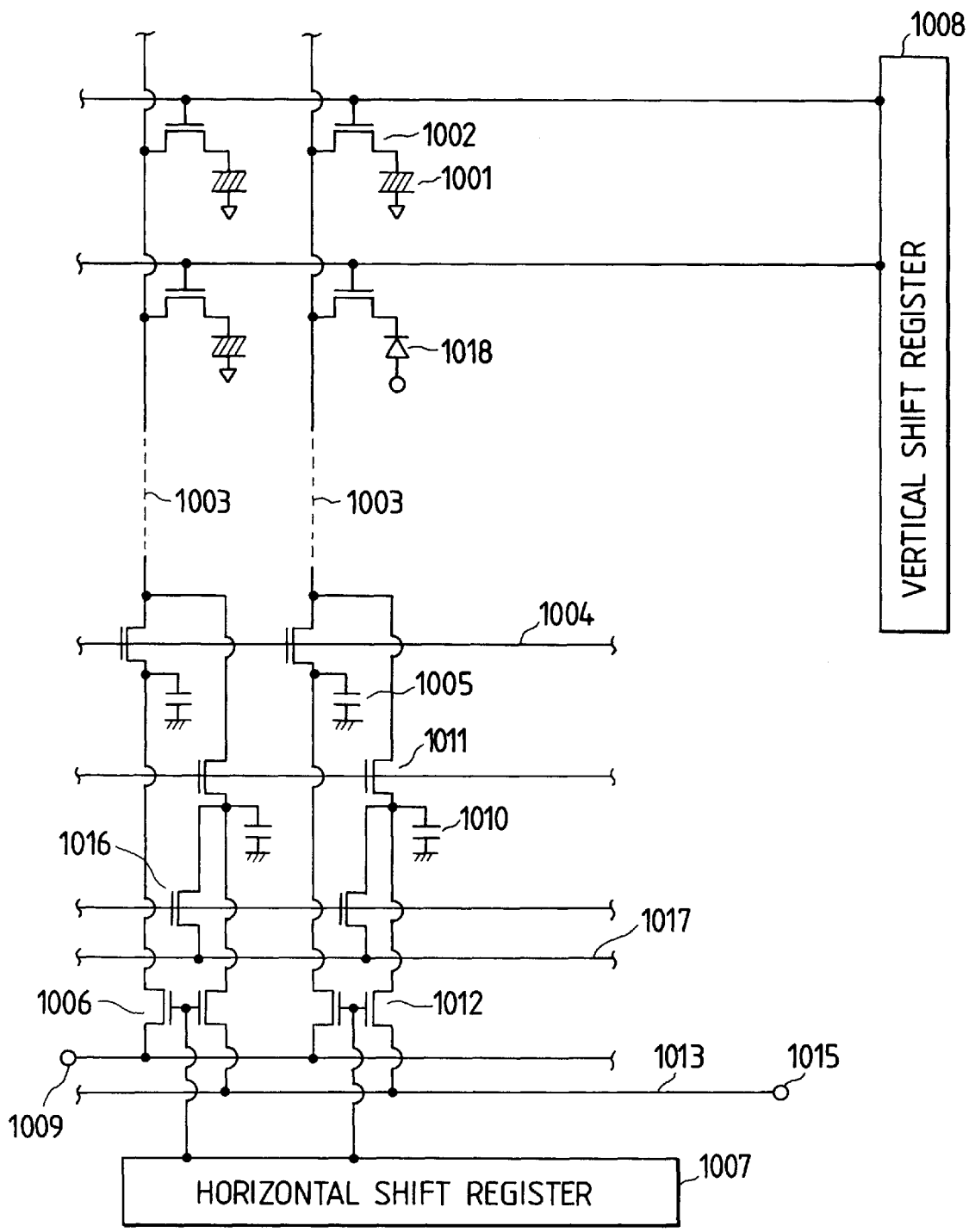

FIG. 18 shows an example of another preferred circuit structure of the image display device, wherein components same as those in FIG. 15 are represented by same numbers and will not be explained further.

In this embodiment, switching TFT's 1006 for accumulating the external signal pulses shown in FIG. 15 into the 1st buffer capacitors 1005 and switching TFT's 1012 for releasing the sensor output signals, coming from the photoelectric converting elements 1018 and accumulated in the 2nd buffer capacitors 1010, in successive manner to the output line 1013 are driven by a single horizontal shift register 1007, with timings as shown (A) to (H) in FIG. 16. Within a horizontal scanning period, there are executed the read-out of the sensor output signals, photosignal accumulation of the next frame and image signal transfer to the 1st buffer capacitors 1005, and, within the blanking period, there are executed to the transfer of the sensor output signals to the 2nd buffer capacitors 1010, resetting of the photoelectric converting elements 1018 and image signal transfer to the liquid crystal cells 1001.

Also in this embodiment, the read-out unit 1010–1017 of the sensor output signals may be connected only to the signal lines connected to the photoelectric converting elements 1018, or may be connected to all the signal lines to read the sensor output signals and to extract the sensor signals by the signal processing after the sensor signal output terminal 1015.

The present embodiment enables, in addition to the advantages of the embodiment 4, further reduction of the panel size, simplification of the driving circuit and improvement in process yield, since there is required only one horizontal shift register.

Embodiment 6

Figure 19:
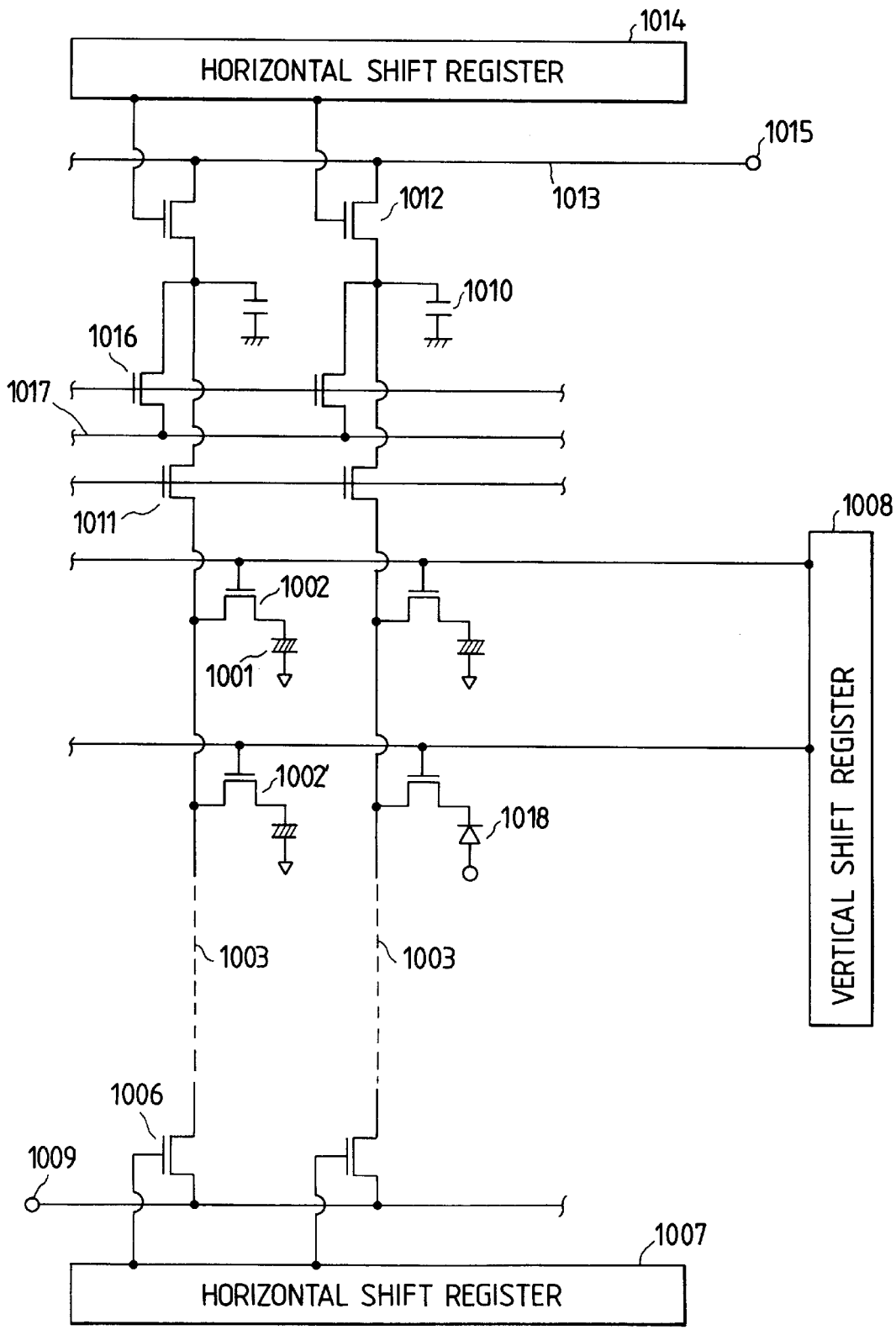

FIG. 19 shows an example of still another preferred circuit structure of the image display device, wherein components same as those in FIG. 15 are represented by same numbers and will not be explained further.

In this embodiment, the image signals are not collectively transferred by every line, but are transferred in succession to the pixels during the horizontal scanning period.

The functions of the present embodiment will be explained in the following, with reference to a timing chart shown (A) to (G) in FIG. 20, wherein a switching TFT connected to the n-th line is represented by 1002, and that connected to the (n+1)th line is represented by 1002'.

Figure 20:
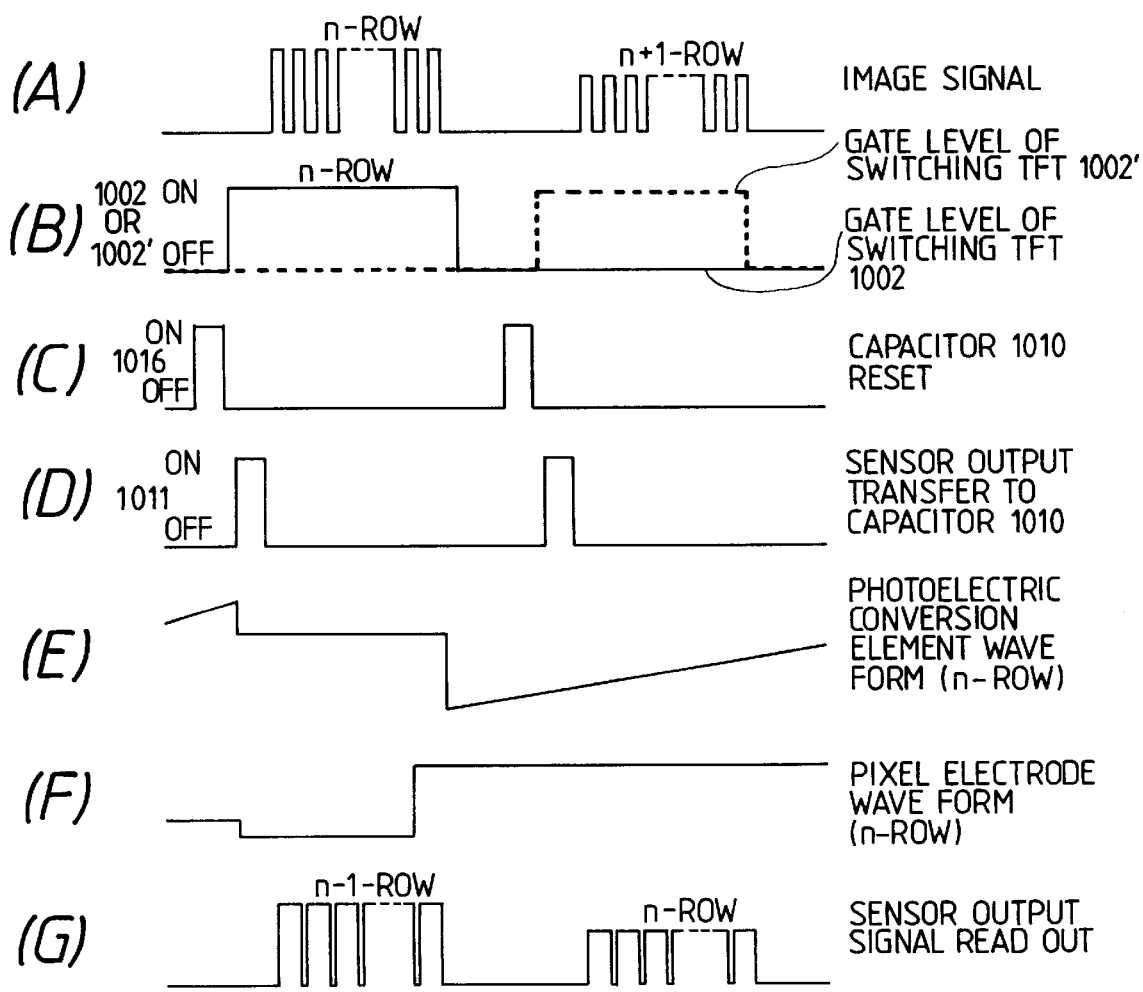

At first the image signals of a line are entered in succession from the external signal input terminal (cf. (A) in FIG. 20). The image signals are transferred, in succession, to the pixels of a line, by the switching TFT's 1006 and the switching TFT's 1002 (cf. (B) in FIG. 20), respectively turned by the 1st horizontal shift register 1007 and the vertical shift register 1008, driven by pulse signals synchronized with the frequency of the image signals. In this operation, a resetting signal is given to the pixels where the photoelectric converting elements are provided. After the signal transfer to the pixel of the last bit of a line, the switching TFT's 1002 are turned off (cf. (B) in FIG. 20). Then the resetting TFT's 1016 are turned on to reset the potential in the buffer capacitors 1010 (cf. (C) in FIG. 20). Then the resetting TFT's 1016 are turned off, while the switching TFT's 1002' and the 2nd transfer gates 1011 are turned on to transfer the sensor output signals from the photoelectric converting elements 1018 to the buffer capacitors 1010 ((D) in FIG. 20). After the sensor output signals are read and the transfer gates 1011 are turned off, the image signals of a next frame are transferred through the switching TFT's 1006 and 1002'.

(E) in FIG. 20 shows the variation in potential of the photoelectric converting element 1018 in these operations. The element accumulates the photo-generated carriers, from the resetting thereof at a timing shown (A) in FIG. 20 to the turning-on of the switching TFT's 1002 and 1011 of the same pixel after a frame period. The accumulating time of the pixels may become different by a horizontal scanning period at maximum within a line, but this difference is uniquely determined by the number of pixels and the drive timing, and can be compensated externally. The accumulated carriers are transferred to the buffer capacitor 1010 at the timing shown (D) in FIG. 20.

Also (F) in FIG. 20 shows the variation in potential of a display pixel in the liquid crystal display device. After the switching TFT 1002 is turned on, the image signals are transferred in succession as shown (A) in FIG. 20 and retained for a frame period. In response to the voltage of the image signal, the liquid crystal cell varies the transmittance, thereby displaying a desired image. The sensor output signals, transferred to the buffer capacitors 1010, are released in succession to the signal output terminal 1015, by means of the switching TFT's 1012 turned on by the 2nd horizontal shift register 1014. The present embodiment enables further reduction in panel size and simplification of the driving circuit, in addition to the advantages of the embodiment 4.

It is also naturally possible to combine this embodiment with the embodiment 5, thereby achieving the driving operation with a single horizontal shift register.

Embodiment 7

Figure 21:
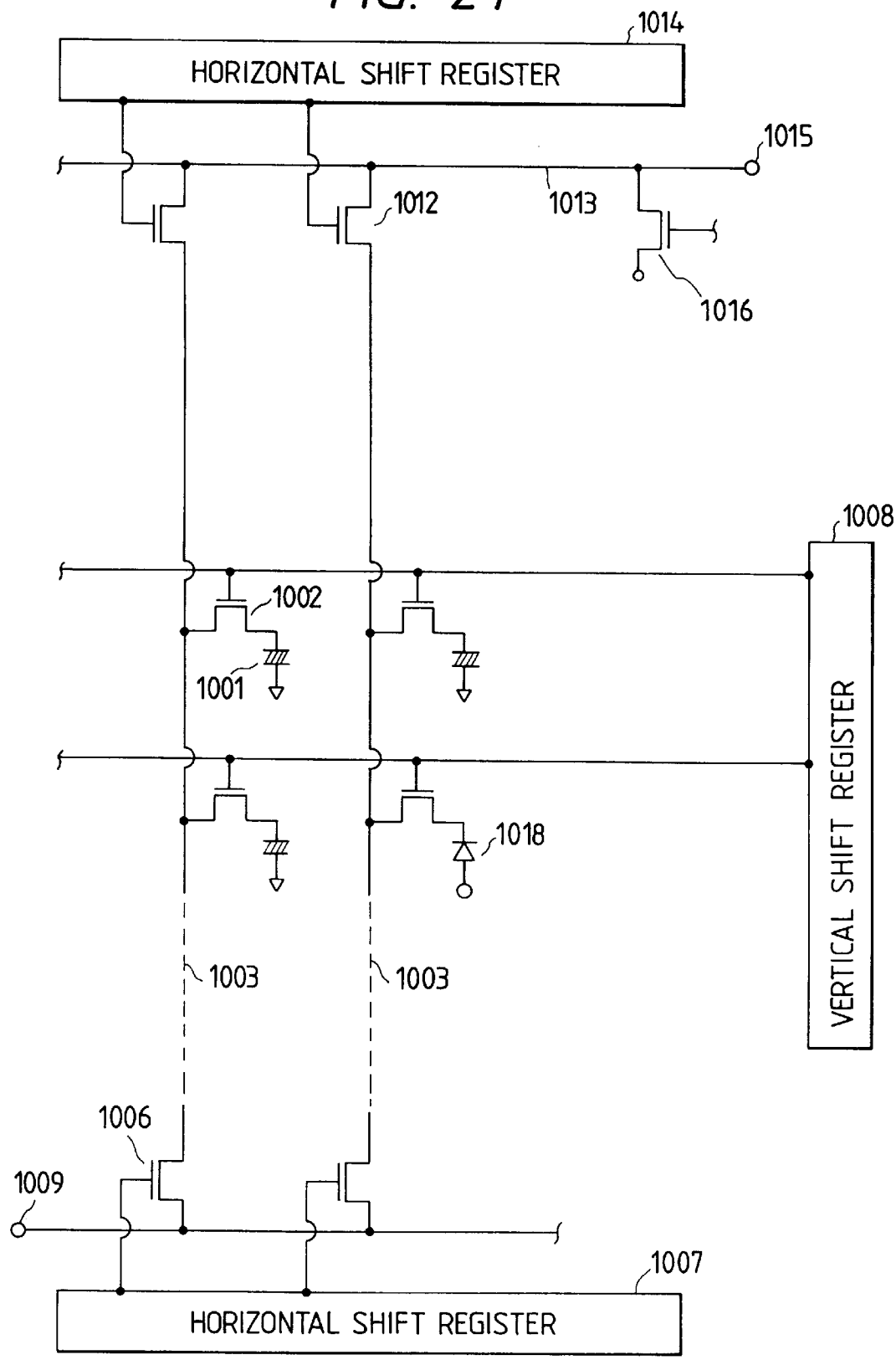

FIG. 21 shows an example of still another preferred circuit structure of the image display device, wherein components same as those in FIG. 15 are represented by same numbers and will not be explained further.

In this embodiment, the image signals are not collectively transferred by every line, but are transferred in succession to the pixels during the horizontal scanning period, and the output signals of the photoelectric converting elements 1018 are not collectively transferred by every line, but are read from the pixels in successive manner during a horizontal scanning period.

The detailed functions of the present embodiment will be explained in the following, with reference to a timing chart shown in (A) to (F) in FIG. 22.

Figure 22:
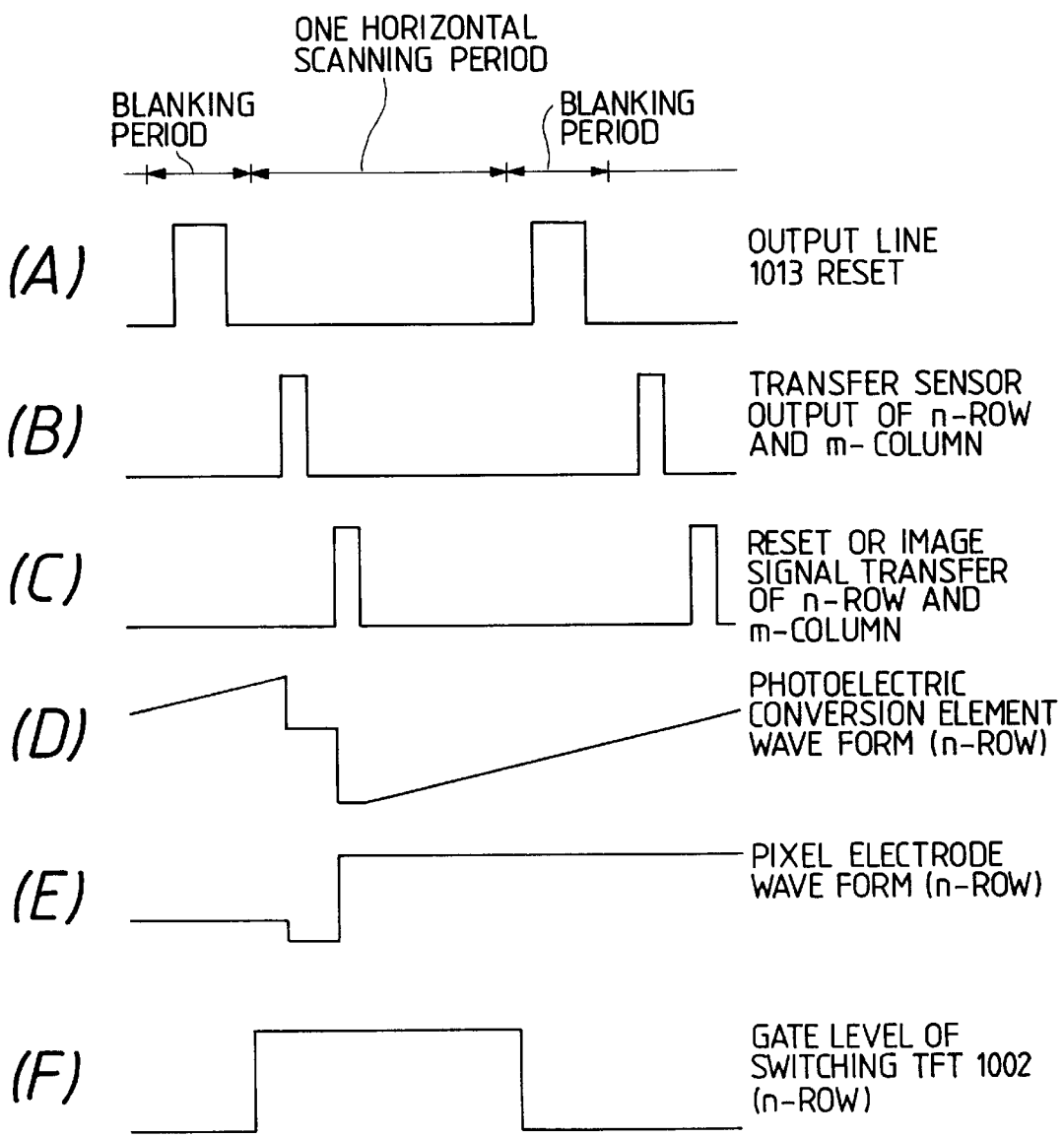

At first, during the blanking period, the resetting TFT 1016 is turned on to reset the signal output line 1013 connected to the signal output terminal 1015 (cf. (A) in FIG. 22). Then the resetting TFT 1016 is turned off, and the switching TFT 1002 of a line is turned on. Then, within a horizontal scanning period, the horizontal shift registers 1014 and 1007 are alternately activated, thereby alternately turning on and off the switching TFT's 1012, 1006 connected to the signal lines 1003. Also the 2nd horizontal shift register 1014 turns on the switching TFT 1012 connected to a signal line 1003, whereby the sensor output signals of the photoelectric converting elements 1018 are released to the signal output terminal 1015 (cf. (B) in FIG. 22). Then, after the switching TFT 1012 is turned off, the horizontal shift register 1007 turns on the switching TFT 1006 connected to a signal line 1003, whereby the image signals from the external signal input terminal 1009 are transferred to the pixels through the switching TFT's 1006 and 1002. At the same time, as already explained in relation to FIG. 15, a signal corresponding to the reset signal is supplied to the pixels where the photoelectric converting elements are provided (cf. (C) in FIG. 22). Subsequently the switching TFT's 1012, 1006 connected to the signal lines are turned on and off in succession, thereby achieving the read-out of the sensor output signals and the writing of the image signals.

In these operations, the variations in potential of the photoelectric converting element and of the display pixel in the liquid crystal display device are respectively shown (D) and (E) in FIG. 22.

In comparison with the embodiment 6, the present embodiment enables further reduction in panel size and further simplification of the driving circuit.

Embodiment 8

Figure 23:
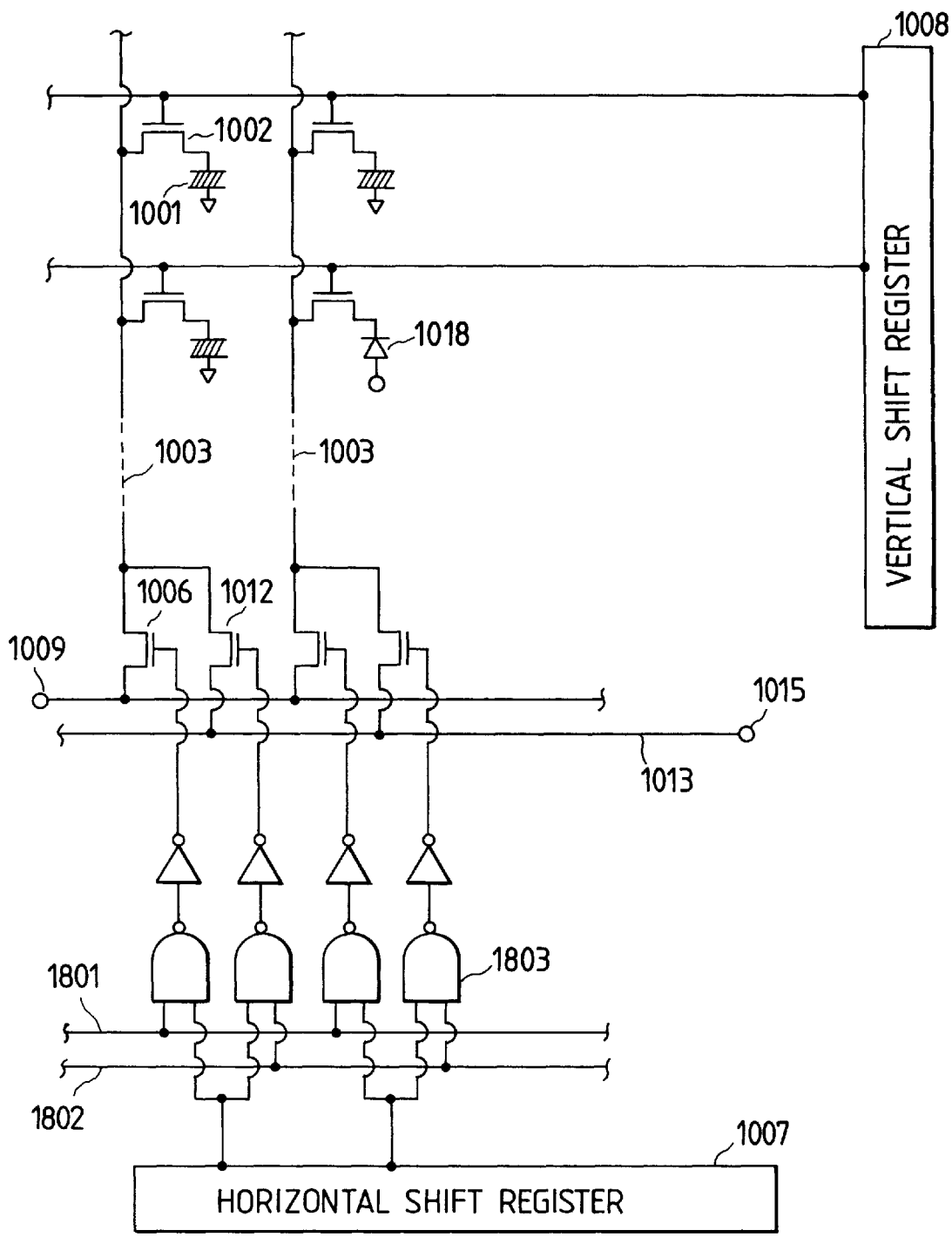

FIG. 23 schematically shows another circuit structure of the image display device. The driving operations of the present embodiment are similar to those of the embodiment 7, and the on/off signals for the switching TFT's 1012 for the sensor output readout and for the switching TFT's 1006 for the external image signal transfer are generated by a shift register 1007, NAND gates 1803, and two control signals 1801, 1802.

In this configuration, a single shift register can attain the second effect of the present invention. The above-explained control in the present embodiment is achieved by the combination of the AND logic gates and two control signals, but such combination is not limitative and a similar function can naturally be attained in other configurations.

Embodiment 9

This embodiment shows another example of the structure of the image display pixel and the photoelectric converting element, usable in the image display devices of the circuit structures shown in the embodiments 5 to 8.

Figure 24:
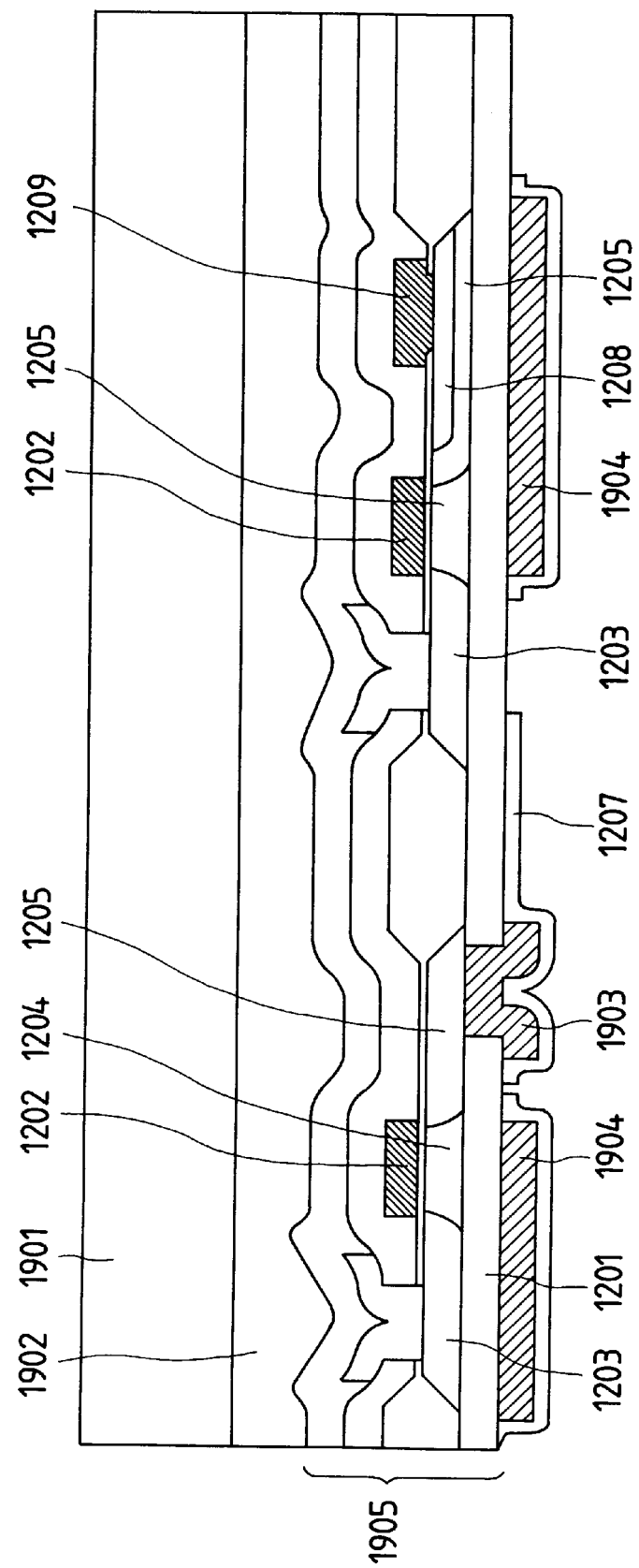

FIG. 24 is a schematic cross-sectional view of the device of the present embodiment, wherein a transparent insulating substrate 1901 for supporting the device is fixed, by an adhesive layer 1902, to a device substrate 1905. Through a contact hole formed in the transparent insulating substrate 1201 under a drain area 1205, there is formed a rear collecting electrode 1903, by which a transparent pixel electrode 1207 is connected to the drain area 1205 of the TFT. A light masking layer 1904, for preventing the light leaking to the TFT of the photoelectric converting unit, is formed, in the present embodiment, simultaneously with the formation of the rear collecting electrode 1903. It is preferably so formed as to cover the entire semiconductor area generating the photocarriers. The configuration of the present embodiment allows flatter formation of the pixel electrodes 1207 thereby reducing distortion in the orientation of the liquid crystal and improving the displayed image quality, and also enables to mask the photoelectric converting elements at the rear side, thereby reducing the light leaking, for example from the rear light source for liquid crystal display and enabling light detection with a high S/N ratio.

Figure 25:
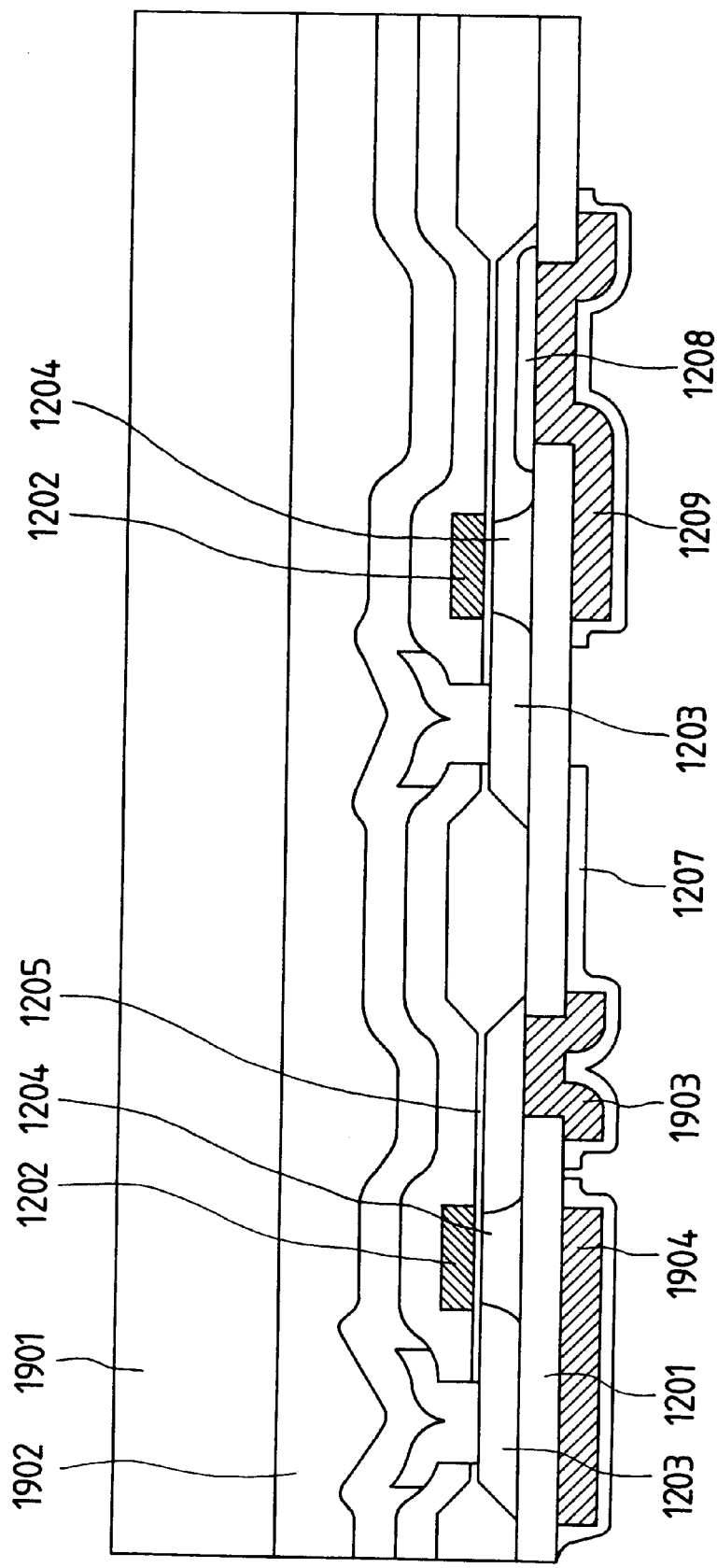

It is naturally possible also, as shown in FIG. 25, to form the semiconductor area 1208 of the opposite conductive type closer to the substrate and to take out the electrode 1209 from the rear side. Also in this case it is desirable to sufficiently mask the entire TFT area from the light.

In the foregoing embodiments 4–9 there are employed PN-photodiodes as the photoelectric converting means, but such means is not limited to such examples. For example, amplifying photoelectric converting elements can reduce the gain loss at the read-out of the sensor output signals, thereby enabling to effect the detection of the line of sight of the observer with a higher sensitivity.

The illumination for the detection of the line of sight is usually conducted with the light outside the visible region, principally the infrared light, so as to be unnoticeable to the observer. For this reason, a visible-light cut-off filter is provided in front of the photoelectric converting means in order to reduce the stray light, but such filter can be dispensed with if there is employed photoelectric conversion means principally sensitive to the infrared light region, such as those utilizing the Schottky junction (IEEE ED May 1991, p. 1094) or those based on HgCdTe (IEEE ED May 1991, p. 1104).

In the foregoing embodiments, the photoelectric converting elements are distributed within the image display area but they may also be arranged around the image display area.

Embodiment 10

The present embodiment relates to a semiconductor device.

Figure 33:
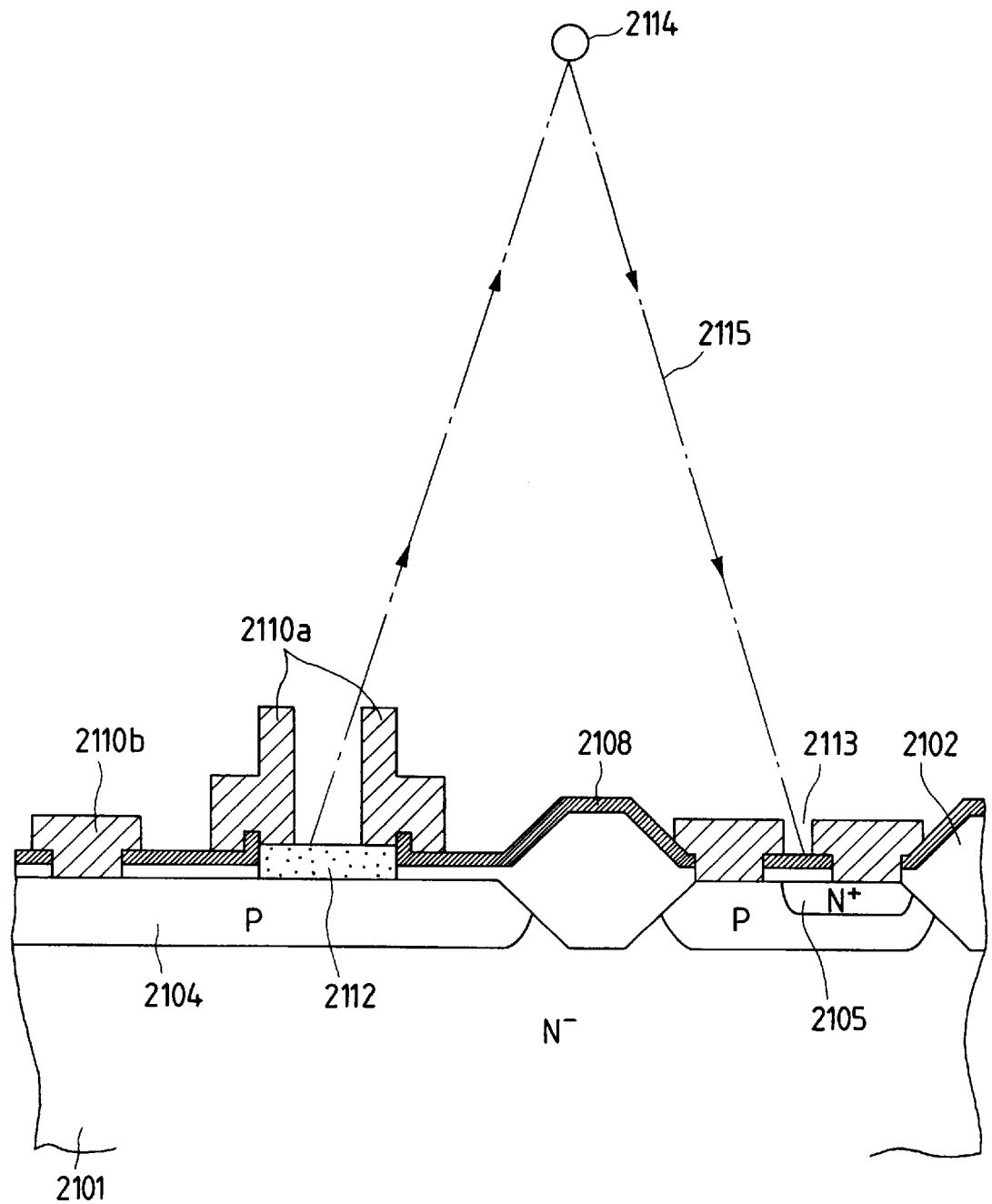
FIGS. 33, 36 and 37 are schematic cross-sectional views showing examples of the semiconductor device of the present invention.

FIG. 33 is a cross-sectional view of the semiconductor device of the present embodiment. The method of preparation thereof will be explained in the following with reference to FIGS. 34A to 34G.

This embodiment provides an example of the semiconductor device integrating the light-emitting source usable for the detection of the line of sight and the light-receiving device for receiving the reflected light for example from a human eye.

The light source may also be used as the illumination means for example for a display panel. Also the light source may also be shaped in a desired form such as a character or a pattern, as a display directly observable by the observer.

At first, on an N—Si (100) substrate 2101 of a resistivity of 1 Ω·cm, a field oxide film 2102 is formed with a thickness of 1 μm. Then a buffer oxide film 2103 is formed with a thickness of 500 Å, and boron ions as P-type impurity are implanted with said field oxide film 2102 as the mask, followed by heat treatment, to form a P-diffusion layer 2104 of a depth of 1 μm (cf. FIG. 34A).

Figure 34A:
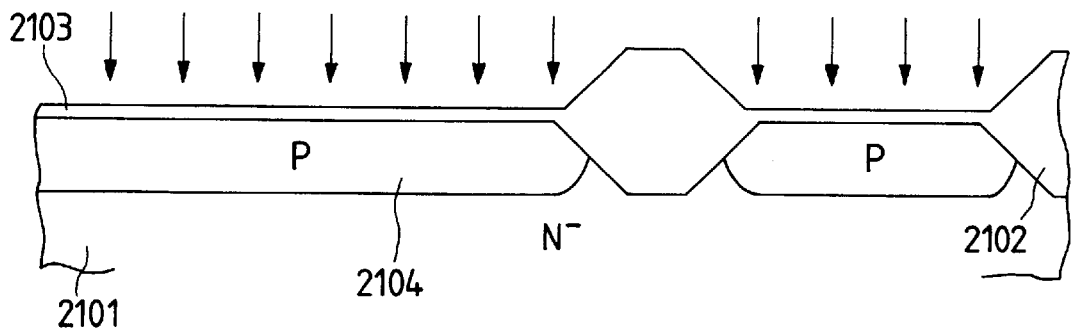
FIGS. 34A to 34G are schematic views showing an example of the preparation method of the semiconductor device of the present invention.
Figure 34B:
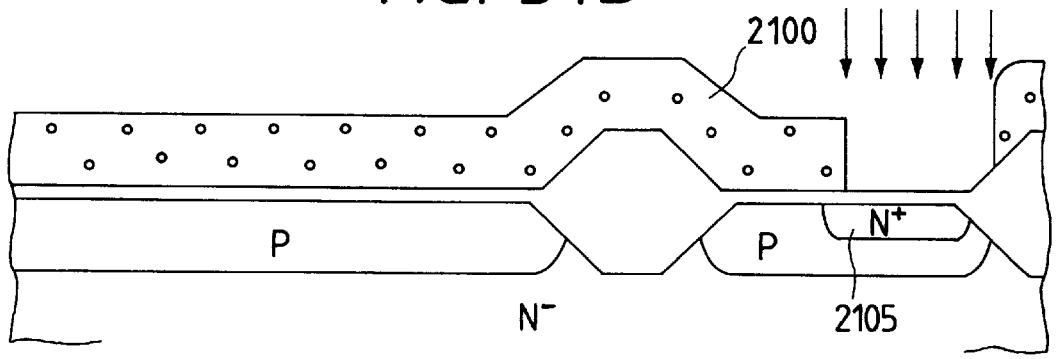
Figure 34C:
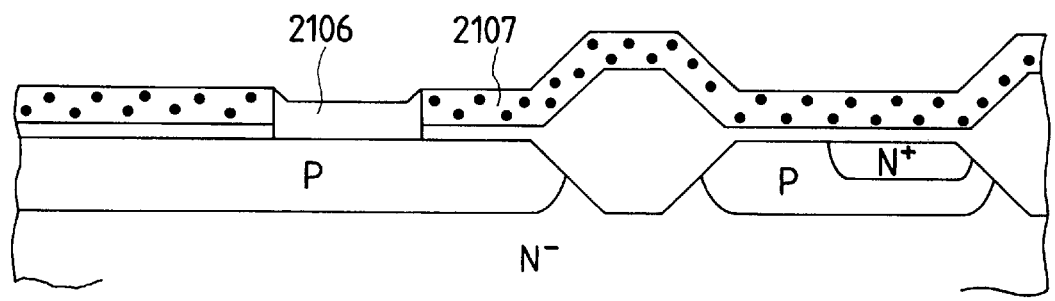
Figure 34D:
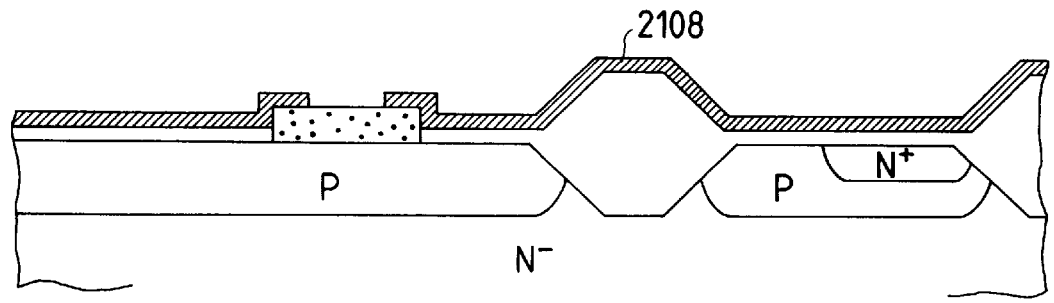
Figure 34E:
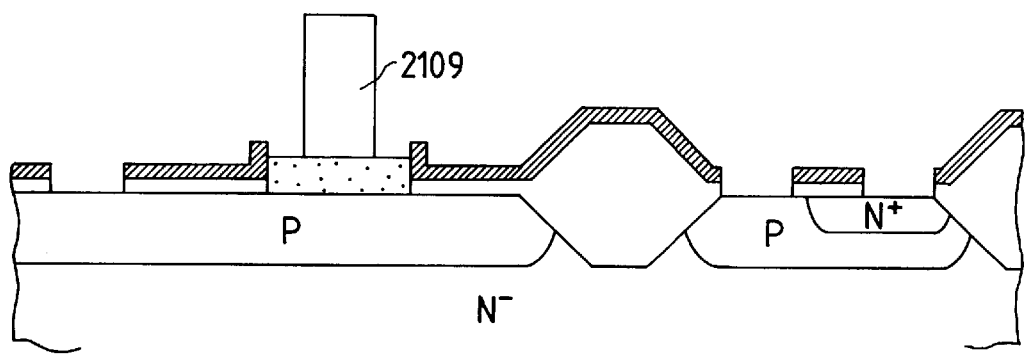
Figure 34F:
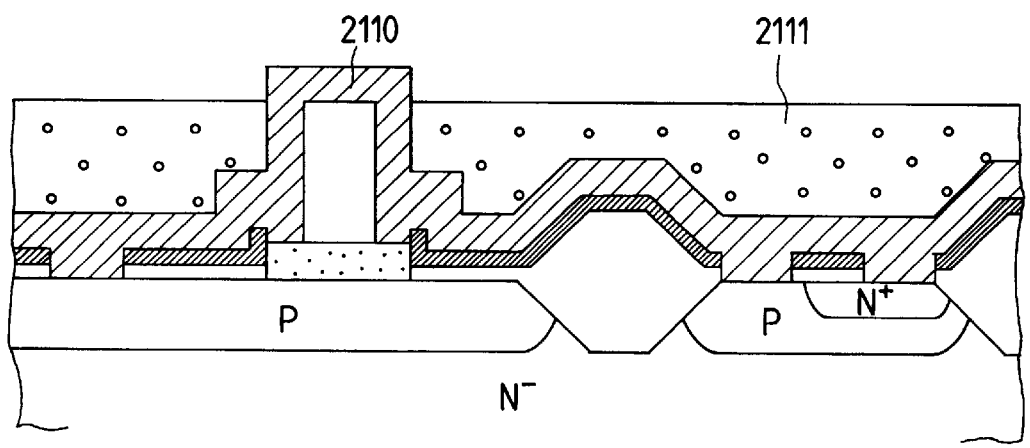
Figure 34G:
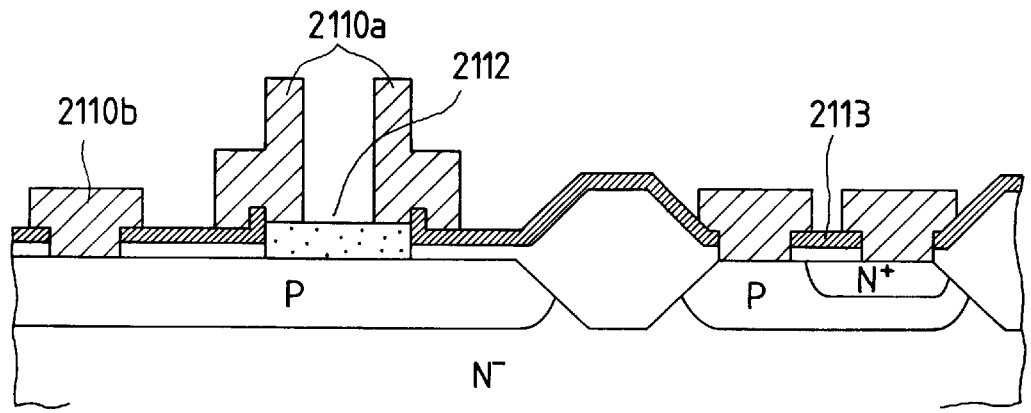

Then arsine as N-type impurity is implanted, utilizing a photoresist mask 2100, to form an N-diffusion layer 2105 of a depth of 0.3 μm in the above-mentioned P-diffusion layer 2104 (FIG. 34B). These two layers constitute a diode functioning as a photodiode.

Then an aperture of about 4 μm square is opened in a part of the buffer oxide film 2103 on the other part of the P-diffusion layer 2104, and Si is epitaxially grown for a thickness of 0.5 μm. Silicon on the above-mentioned aperture becomes monocrystalline silicon 2106 by the influence of the underlying silicon, but that on the oxide film 2103 becomes polycrystalline silicon 2107 (cf. FIG. 34C).

Subsequently the polysilicon 2107 is removed by etching solution capable of selectively etching polysilicon, such as potassium iodide, then a nitride film 2108 capable of withstanding the anodizing is deposited with a thickness of 1500

Å, and an aperture is formed on the monocrystalline silicon 2106 to be subjected to anodizing. Then the monocrystalline silicon 2106 is made porous, by anodizing with 35% alcoholic solution of HF and with a current of about 25 mA/cm$^2$ (cf. FIG. 34D).

Subsequently contact holes for the electrodes are opened to expose Si surface. Also in a portion corresponding to the light-emitting unit, a pillar 2109 is formed for example of heat-resistant polyimide resin, in order to form a light masking portion for preventing light leakage to the outside (cf. FIG. 34E).

Then a metal 2110 of good step coverage, such as aluminum, is deposited, and a thick resist layer 2111, as a planarization material is coated over the entire surface. Subsequently the resist 2111 is etched back until the aluminum 2110 alone of the above-mentioned pillar becomes exposed (cf. FIG. 34F).

Finally the aluminum on top of the pillar 2109 is etched off, then the planarizing resist 2111 is removed, and the pillar 2109 of polyimide resin is removed. Subsequently the Al electrodes are patterned in the ordinary method to form a light-emitting portion 2112 and a light-receiving portion 2113 (cf. FIG. 34G). In this operation, it is necessary to pay attention to the coverage of the light masking portion 2110a. If the light masking portion 2110a cannot be well protected by the resist, it is also possible to separate the light masking portion 2110a and the electrode 2110b in different layers, and to separately form the light masking portion 2110a after the formation of the electrode 2110b.

Now reference is made to FIG. 33 for explaining the functions of the light-emitting portion 2112 and the light-receiving portion 2113, formed with porous silicon simultaneously on the semiconductor substrate. A voltage of several volts, applied between the light masking portion 2110a, serving also as the electrode of the light-emitting portion 2112, and the electrode 2110b of the P-diffusion layer 2104, induces a current between both electrodes, whereby the light-emitting portion of the porous layer emits light. The emitted light is guided without diffusion, by the light masking portion 2110a, and is addressed to an object 2114 through an unrepresented optical system. The light directed into the Si substrate is rapidly absorbed by the Si substrate itself or by the depletion layer between the inversely biased Si substrate 2101 and the P-diffusion layer 2104, so that it does not constitute stray light transmitted far within the Si substrate.

The light scattered by the object 2114 passes a path 2115 and enters the photodiode of the light-receiving portion. Since the light is sufficiently focused by the optical system, the adjacent light-receiving portion receives only very little light.

Since the incident position of the light is uniquely determined by the light-emitting portion, optical system, object etc., there can be achieved the detection of the object position by the scanning operation with the light-emitting portions, the optical system or the light-receiving portions.

Figure 35:
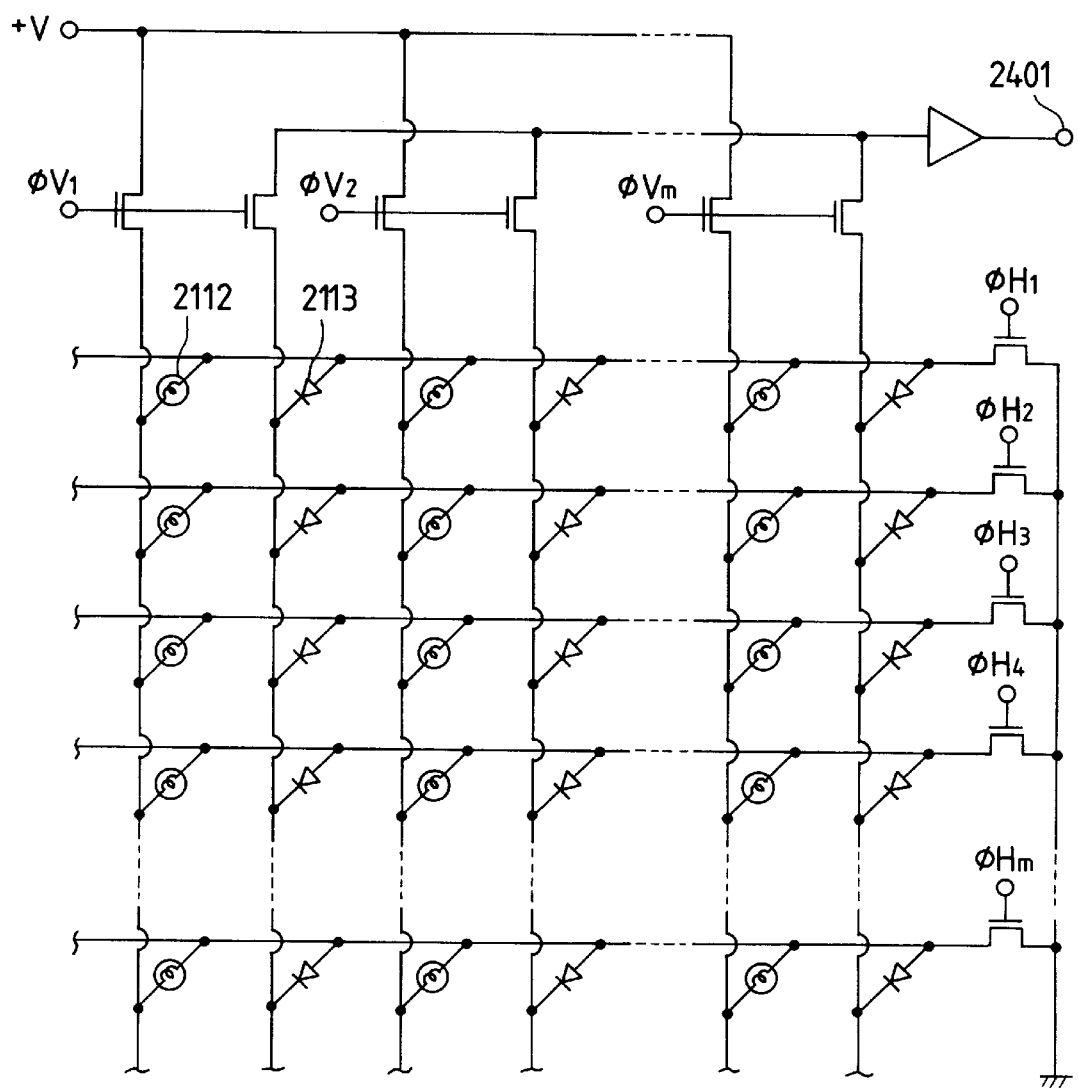
FIG. 35 is a circuit diagram showing an example of the driving circuit for the semiconductor device of the present invention.

FIG. 35 illustrates a part of the driving circuit for the semiconductor device of the present embodiment, wherein the light-emitting portion 2112 and the light-receiving portion 2113, consisting of a photodiode, are positioned optically symmetrical, with respect to an unrepresented optical system. The light-emitting portion 2112 emits light by the application of an ON voltage to terminals $\phi V_1$ and $\phi H_1$.

Said photodiode 2113 induces a photocurrent only in the presence of an object reflecting the emitted light, and the photocurrent is amplified and supplied to an output terminal 2401. In the present embodiment, the above-explained circuit is arranged in an m×n matrix, with terminals $\phi V_1$–$V_m$ and $\phi H_1$–$\phi H_n$, whereby the position of the object can be two-dimensionally detected.

The light-receiving element to be employed in this embodiment is not limited to a photodiode, but can also be other known photosensors such as CCD or phototransistor.

The semiconductor device of the present invention, integrating the light-emitting source and the light-receiving element within a same chip as explained above, can simplify the system and reduce the cost thereof, when employed as a sensor for detecting the position or image of an object. Particularly, when it is utilized as a contact sensor in which the object is positioned close to the device, there can be constructed an optical equipment not requiring the optical system involving lens etc., thereby significantly reducing the number of component parts, also drastically reduce to volume of the entire equipment and further reducing the manufacturing cost.

Embodiment 11

In the present embodiment, the light-emitting portion is composed of a polysilicon or monocrystalline silicon interface instead of porous silicon in the embodiment 10.

Figure 36:
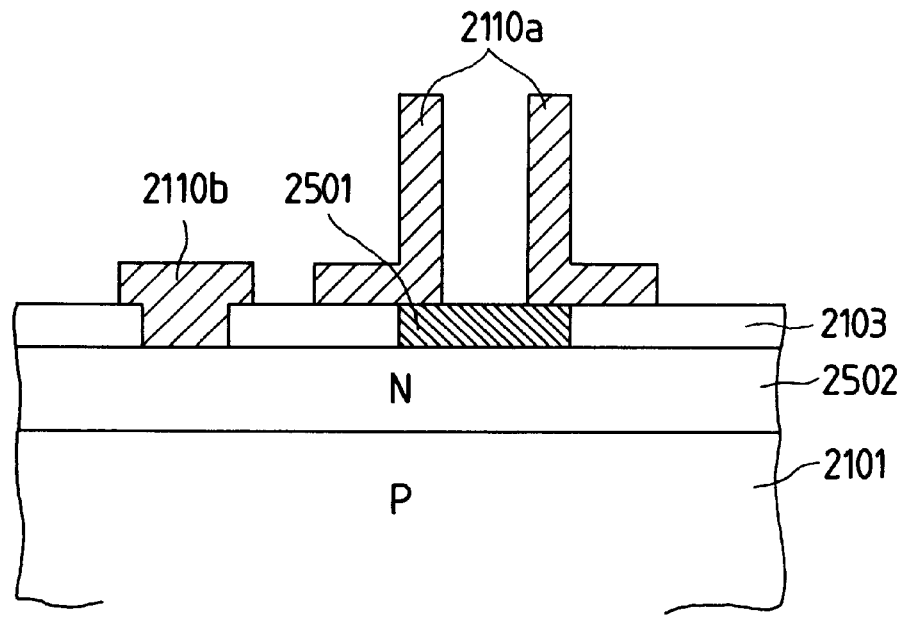

FIG. 36 is a cross-sectional view of the light-emitting portion of the present embodiment, containing N$^+$ polysilicon 2501. As in case of porous silicon in the embodiment 10, the unnecessary portion of polysilicon is removed or oxidized. When a voltage is applied between electrodes 2110a and 2110b, a current is induced therebetween whereby the light is emitted at the interface between the N$^+$ polysilicon 2501 and the N-diffusion layer 2502 consisting of monocrystalline silicon. Similarly amorphous silicon is usable as the light source.

Embodiment 12

This embodiment utilizes crystal defects in monocrystalline silicon as the light-emitting portion, instead of porous silicon in the embodiment 10.

Figure 37:
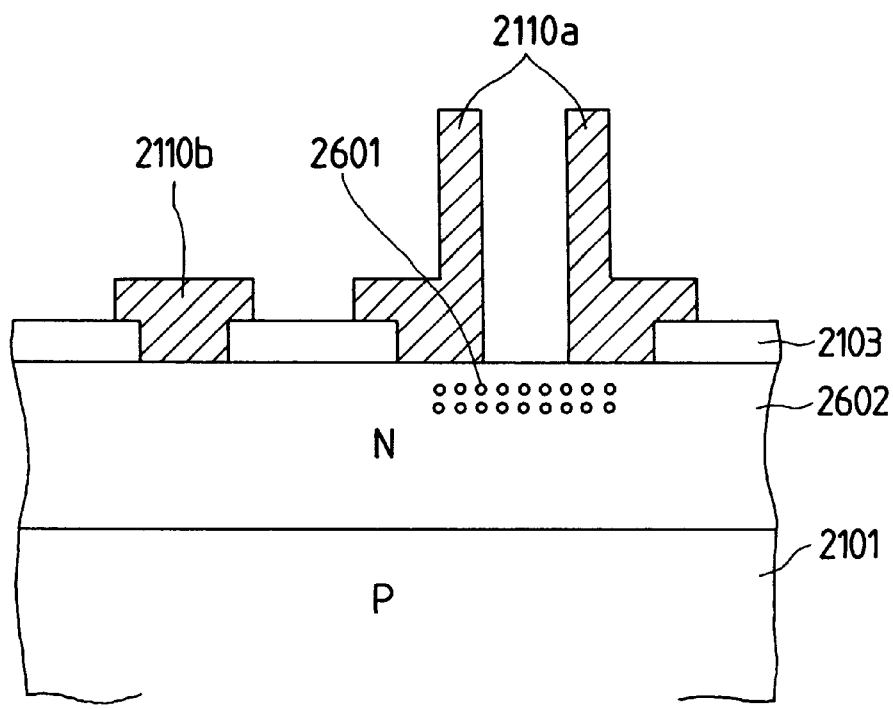

FIG. 37 is a cross-sectional view of the light-emitting portion in the present embodiment, including the above-mentioned crystal defects 2601. The crystal defects in silicon can be formed, for example, by oxygen ion implantation in the course of process. The N-diffusion layer 2602 for the electric isolation has to be made deeper than the defects 2601, because the junction leak increases if the crystal defects cross the P-N junction. In the present embodiment, sufficient light emission can be obtained only with a relatively high voltage. Consequently, for the purpose of reducing the unnecessary electric power consumption, the sheet resistance of the diffusion layer 2602 should preferably be higher.

Because of such nature, the present embodiment is suitable for combination with a device of high voltage and high output.

Embodiment 13

This embodiment is to arrange the light-emitting elements, as shown in the embodiments 10 to 12, in an array and to modify the driving method, thereby intensifying the output for positional detection. More specifically, all the light sources contained in a single cell emit light at the same time, and the light-receiving portions only effect the scanning operation.

This embodiment can intensify the detected signal, since the amount of light entering the object increases drastically.

Figure 38:
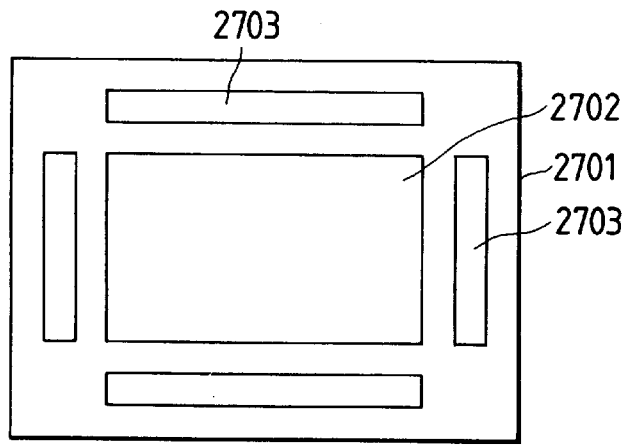
FIGS. 38 and 39 are schematic plan views showing examples of the arrangement of the light-receiving part and the light-emitting part.

In FIG. 38, there are shown a substrate 2701, an x-y matrix 2702 of the light-receiving elements, and light-emitting portions 2703 arranged in uniform arrays. However the optical system has to be separated in the light-emitting portion and the light-receiving portion in order to condense the light onto the object. The present embodiment is suitable for a system in which the object is dark or low in reflectance and requires a large amount of light for illumination.

Embodiment 14

Figure 39:
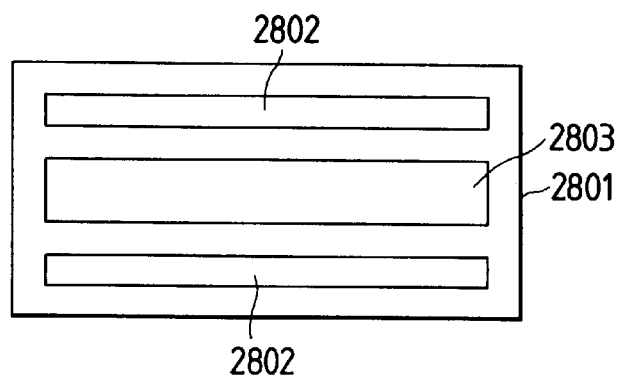

This embodiment is to arrange the light-receiving elements, as shown in the embodiment 10, in an array as shown in FIG. 39 and to modify the driving method, thereby intensifying the output for positional detection. In FIG. 39 there are shown a substrate 2801, a one-dimensional matrix 2802 of the light-emitting elements, and a uniform array 2803 of the light-receiving elements. Contrary to the embodiment 13, the detection of position is executed by the scanning operation of the light-emitting elements only. This embodiment is suitable for a system in which the object causes random scattering.

The arrangements of the light-emitting portion and the light-receiving portion are not limited to those in this embodiment or in the embodiment 13, but can be optimized according to the system.

Besides, on-chip lenses may be provided, by the already known technology, on the light-emitting portion or on the light-receiving portion to further improve the efficiency of light emission and reception, thereby elevating the sensitivity and S/N ratio of the positional detection.

Also there can be easily conceived examples employing other known silicon processes, so that various designing can be assured according to the desired system.

Also the LED 2901 and the photoelectric converter 2905, shown in FIG. 1, may be replaced by the semiconductor device shown in the foregoing embodiments 10–14 to dispense with the half mirror 2904, whereby there can be provided optical equipment excellent in space and cost.

In addition, further compactization and cost reduction can be achieved in the optical equipment by incorporating the concept of the semiconductor device of the embodiments 10–12 into the image display device shown in the embodiments 4–9, namely by forming the pixel portion for image display, the photoelectric converting elements (light-receiving portion) and the light-emitting portion within the image display device.

In such case, the light-emitting portion may continuously emit light, or intermittently in synchronization with the timing of the detection of the line of sight. The latter case, capable of further reducing the electric power consumption, is preferable particularly in the application to a small-sized optical equipment such as a video camera, as the battery of a large capacity can be dispensed with.

Such configuration is naturally preferable also in case of utilizing the illuminating light source of the image display means for the light source for the detection of the line of sight, since the drive with the battery of a smaller capacity becomes possible.

Furthermore, in case the porous silicon is used for the light-emitting portion, the light of a desired wavelength can be emitted by the control of the pore diameter and pore density of the porous material. It is therefore rendered possible to display various colors on a single semiconductor chip, thereby broadening the colors and applications of the display.

As detailedly explained in the foregoing, the present invention provides the following advantages:

(1) The rear light source associated with the image display device is utilized also as the illuminating light source for the detection of the line of sight, thereby adding the sight line detecting function without the addition of a new illuminating light source, also reducing the size and weight of the entire equipment, and contributing to the realization of an inexpensive and compact optical equipment, such as a video camera, with the sight line detecting function. In addition, there can be achieved reduction in the number of component parts, enabling further reduction in cost. Furthermore, there is achieved reduction of the electric power consumption and heat generation of the infrared light source, thereby contributing to the designing of an equipment with compactor size and reduced power consumption.

(2) The common use of the driving circuit for image display and that for the photoelectric converting means avoids, in an image display device having additional sight line detecting function, the necessity for the addition of the independent photoelectric converting means or the drive means therefor, thus enabling compactization, simplification and cost reduction of the entire equipment.

(3) The light-emitting unit and the light-receiving unit can be integrated on a same silicon chip, so that, in case of use of such chip as a sensor of various optical equipment for detecting the image or position of an object, such system can be realized extremely compactly and very inexpensively.

Particularly in case of use in a contact sensor in which the object is positioned in the vicinity of the device, there can be constructed an optical device not requiring the optical system involving lens etc., thereby significantly reducing the number of component parts and drastically reducing the volume of the entire equipment.

Also its simplicity in the configuration, the above-mentioned device can be adopted in various applications, such as a contact sensor for the copying machine, an optical sensor for various handy equipment, an optical sensor for small-sized equipment to be used in an attached state to the human body.

In these cases there can naturally be attained various advantages mentioned in the foregoing embodiments.

What is claimed is:

1. An image display device comprising:

a rear light source for emitting a light including a first component of a visible region and a second component having a longer wavelength than the visible region;

image display means comprising an image display region provided with a plurality of pixels in a matrix, said image display means effecting display by passing the light emitted from said rear light source through said plurality of pixels, wherein at least a part of said image display region of said image display means passes the second component having the longer wavelength than the visible region of the light emitted from said rear light source; and a fluorescent lamp to generate said visible region component and said longer wavelength component outside the visible region, wherein said fluorescent lamp includes fluorescent materials emitting red light, green light, blue light and infrared and/or near-infrared light.

2. An image display device according to claim 1, wherein the longer wavelength component outside the visible region contains a component of 850–950 nm.

3. An image display device according to claim 1, further comprising a filter transmitting at least said longer wavelength component outside the visible region.

4. An image display device according to claim 3, wherein said filter substantially does not transmit the visible region component.

5. An image display device according to claim 3, wherein said filter further transmits light of a wavelength of the visible region component.

6. An image display device according to claim 1, wherein said visible region component is colored light selected from red light, green light and blue light.

7. An image display device according to claim 1, wherein said light source includes a 1st light source principally emitting said visible region component and a 2nd light source principally emitting said longer wavelength component outside the visible region.

8. An image display device according to claim 1, wherein said light source includes a semiconductor.

9. An image display device according to claim 1, wherein said image display means further includes a light-receiving unit.

10. An image display device according to claim 1, further comprising a light-receiving unit.

11. An image display device according to claim 1, wherein said image display means is a liquid crystal display.

12. An image display device comprising:
a rear light source for emitting a light including a first component of a visible region and a second component having a longer wavelength than the visible region;
image display means comprising an image display region provided with a plurality of pixels in a matrix, said image display means effecting display by passing the light emitted from said rear light source through said plurality of pixels, wherein at least a part of said image display region of said image display means passes the second component having the longer wavelength than the visible region of the light emitted from said rear light source; and
a filter transmitting at least said longer wavelength component outside the visible region, wherein
said filter is provided at least in an area between said pixels.

13. An image display device comprising:
a rear light source for emitting a light including a first component of a visible region and a second component having a longer wavelength than the visible region;
image display means comprising an image display region provided with a plurality of pixels in a matrix, said image display means effecting display by passing the light emitted from said rear light source through said plurality of pixels, wherein at least a part of said image display region of said image display means passes the second component having the longer wavelength than the visible region of the light emitted from said rear light source; and
a filter transmitting at least said longer wavelength component outside the visible region, wherein
said filter is provided at least within an image display area of said image display means.

14. An image display device comprising:
a rear light source for emitting a light including a first component of a visible region and a second component having a longer wavelength than the visible region;
image display means comprising an image display region provided with a plurality of pixels in a matrix, said image display means effecting display by passing the light emitted from said rear light source through said plurality of pixels, wherein at least a part of said image display region of said image display means passes the second component having the longer wavelength than the visible region of the light emitted from said rear light source; and
a filter transmitting at least said longer wavelength component outside the visible region, wherein
said filter has a configuration substantially the same as that of said pixels.

15. An image display device comprising:
a rear light source for emitting a light including a first component of a visible region and a second component having a longer wavelength than the visible region;
image display means comprising an image display region provided with a plurality of pixels, said image display means effecting display by passing the light emitted from said rear light source through said plurality of pixels, wherein at least a part of said image display region of said image display means passes the second component having the longer wavelength than the visible region of the light emitted from said rear light source;
a fluorescent lamp to generate said visible region component and said longer wavelength component outside the visible region, wherein
said fluorescent lamp includes fluorescent materials emitting red light, green light, blue light and infrared and/or near-infrared light.

16. An image display device comprising:
a rear light source for emitting a light including a first component of a visible region and a second component having a longer wavelength than the visible region;
image display means comprising an image display region provided with a plurality of pixels, said image display means effecting display by passing the light emitted from said rear light source through said plurality of pixels, wherein at least a part of said image display region of said image display means passes the second component having the longer wavelength than the visible region of the light emitted from said rear light source; and
a filter transmitting at least said longer wavelength component outside the visible region, wherein
said filter is provided at least in an area between said pixels.

17. An image display device comprising:
a rear light source for emitting a light including a first component of a visible region and a second component having a longer wavelength than the visible region;
image display means comprising an image display region provided with a plurality of pixels, said image display means effecting display by passing the light emitted from said rear light source through said plurality of pixels, wherein at least a part of said image display region of said image display means passes the second component having the longer wavelength than the visible region of the light emitted from said rear light source; and
a filter transmitting at least said longer wavelength component outside the visible region, wherein
said filter is provided at least within an image display area of said image display means.

18. An image display device comprising:

a rear light source for emitting a light including a first component of a visible region and a second component having a longer wavelength than the visible region;

image display means comprising an image display region provided with a plurality of pixels, said image display means effecting display by passing the light emitted from said rear light source through said plurality of pixels, wherein at least a part of said image display region of said image display means passes the second component having the longer wavelength than the visible region of the light emitted from said rear light source; and a filter transmitting at least said longer wavelength component outside the visible region, wherein said filter has a configuration substantially the same as that of said pixels.

* * * * *

UNITED STATES PATENT AND TRADEMARK OFFICE
CERTIFICATE OF CORRECTION

PATENT NO. : 5,926,238

DATED : July 20, 1999

INVENTOR(S): SHUNSUKE INOUE, ET AL.

Page 1 of 2

It is certified that error appears in the above-identified patent and that said Letters Patent is hereby corrected as shown below:

On the title page: Item

[56] REFERENCES CITED:

| FOREIGN PATENT DOCUMENTS, | "1241511 | | --1-241511 |
|---|---|---|---|
| | 2012023 | | 2-012023 |
| | 4225323 | should | 4-225323 |
| | 4240438 | read | 4-240438 |
| | 4347127 | | 4-347127 |
| | 4355427" | | 4-355427--. |

COLUMN 1:

Line 30, "tube) a," should read --tube), a--.

COLUMN 20:

Line 17, "to" should read --the--.

UNITED STATES PATENT AND TRADEMARK OFFICE
CERTIFICATE OF CORRECTION

PATENT NO. : 5,926,238

DATED : July 20, 1999

INVENTOR(S) : SHUNSUKE INOUE, ET AL.

Page 2 of 2

It is certified that error appears in the above-identified patent and that said Letters Patent is hereby corrected as shown below:

<u>COLUMN 22</u>:

Line 35, "Also" should read --Also, given--.

Signed and Sealed this

Ninth Day of January, 2001

Attest:

Q. TODD DICKINSON

*Attesting Officer*          *Commissioner of Patents and Trademarks*